(12) United States Patent
Senda et al.

(10) Patent No.: US 9,196,647 B2
(45) Date of Patent: Nov. 24, 2015

(54) IMAGE PICKUP UNIT AND IMAGE PICKUP DISPLAY SYSTEM

(71) Applicant: Sony Corporation, Tokyo (JP)

(72) Inventors: Michiru Senda, Kanagawa (JP);
Tsutomu Tanaka, Kanagawa (JP);
Yasuhiro Yamada, Kanagawa (JP);
Makoto Takatoku, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 121 days.

(21) Appl. No.: 13/767,952

(22) Filed: Feb. 15, 2013

(65) Prior Publication Data
US 2013/0222660 A1 Aug. 29, 2013

(30) Foreign Application Priority Data
Feb. 24, 2012 (JP) .................................. 2012-038231

(51) Int. Cl.
| | |
|---|---|
| H04N 5/357 | (2011.01) |
| H04N 5/361 | (2011.01) |
| H04N 5/374 | (2011.01) |
| H01L 27/146 | (2006.01) |
| H04N 5/372 | (2011.01) |
| G01T 1/24 | (2006.01) |

(52) U.S. Cl.
CPC .......... *H01L 27/14641* (2013.01); *G01T 1/247* (2013.01); *H04N 5/357* (2013.01); *H04N 5/361* (2013.01); *H04N 5/372* (2013.01); *H04N 5/374* (2013.01)

(58) Field of Classification Search
CPC ....... H04N 5/357; H04N 5/361; H04N 5/374; H04N 3/1506; H01L 27/14612
USPC ................................... 348/302, 308
See application file for complete search history.

(56) References Cited

U.S. PATENT DOCUMENTS

| | | | |
|---|---|---|---|
| 7,709,868 B2 * | 5/2010 | Pak et al. ........................ | 257/290 |
| 2009/0032680 A1 * | 2/2009 | Watanabe et al. ........... | 250/208.1 |
| 2009/0290050 A1 * | 11/2009 | Herrmann et al. ............ | 348/243 |
| 2010/0066868 A1 * | 3/2010 | Shohara ........................ | 348/241 |
| 2011/0216240 A1 * | 9/2011 | Ohno ............................ | 348/441 |

FOREIGN PATENT DOCUMENTS

JP 2011-135561 A 7/2011

* cited by examiner

*Primary Examiner* — Mekonnnen Dagnew
(74) *Attorney, Agent, or Firm* — Hazuki International, LLC

(57) ABSTRACT

An image pickup unit includes: an image pickup section including a plurality of pixels, the plurality of pixels each including a photoelectric converter device and a field-effect transistor; and a driving section reading out a signal charge with use of the transistor, the signal charge being accumulated in each of the plurality of pixels. The driving section turns off the transistor by applying an off-voltage to the transistor, the off-voltage being set in consideration of an off-leakage current between a source and a drain of the transistor.

21 Claims, 20 Drawing Sheets

IMAGE PICKUP UNIT AND IMAGE PICKUP DISPLAY SYSTEM

CROSS REFERENCE TO RELATED APPLICATION

This application claims the priority benefit of Japanese Patent Application JP 2012-038231 filed in the Japanese Patent Office on Feb. 24, 2012, the entire content of which is hereby incorporated by reference.

BACKGROUND

The present disclosure relates to an image pickup unit having photoelectric converter devices, and an image pickup display system including such an image pickup unit.

As an image pickup unit having a photoelectric converter device in a pixel (image pickup pixel), various types have been proposed in the past. Examples of such an image pickup unit include a so-called optical touch panel, a radiographic image pickup unit, and the like (for example, see Japanese Unexamined Patent Application Publication No. 2011-135561).

SUMMARY

In an image pickup unit as described above, signal charges accumulated in each pixel are read out using field-effect transistors to obtain image signals. It is desirable to further improve the quality in pickup images based on those image signals.

It is desirable to provide an image pickup unit that makes it possible to achieve high quality in pickup images, and an image pickup display system including such an image pickup unit.

An image pickup unit according to an embodiment of the present disclosure includes: an image pickup section including a plurality of pixels, the plurality of pixels each including a photoelectric converter device and a field-effect transistor; and a driving section reading out a signal charge with use of the transistor, the signal charge being accumulated in each of the plurality of pixels. The driving section turns off the transistor by applying an off-voltage to the transistor, the off-voltage being set in consideration of an off-leakage current between a source and a drain of the transistor.

An image pickup display system according to an embodiment of the present disclosure includes: an image pickup unit; and a display unit performing image display based on an image pickup signal obtained by the image pickup unit. The image pickup unit includes: an image pickup section including a plurality of pixels, the plurality of pixels each including a photoelectric converter device and a field-effect transistor; and a driving section reading out a signal charge with use of the transistor, the signal charge being accumulated in each of the plurality of pixels. The driving section turns off the transistor by applying an off-voltage to the transistor, the off-voltage being set in consideration of an off-leakage current between a source and a drain of the transistor.

In the image pickup unit and the image pickup display system according to the respective embodiments of the present disclosure, photoelectric conversion based on incident light is carried out in each pixel in the image pickup section, and subsequently, signal charges are read out. Thus, pickup images based on the incident light are obtained. At the time of a turn-off operation of the transistor, the driving section applies, to a gate of the transistor, that is set in consideration of an off-leakage current between a source and a drain. This suppresses occurrence of noise or variation in dark level that are caused by the off-leakage current of the transistor and a dark current of the photoelectric converter device.

According to the image pickup unit and the image pickup display system according to the respective embodiments of the present disclosure, it is possible to obtain pickup images based on the incident light in such a manner that the driving section reads out signal charges from each pixel including the photoelectric converter device and the field-effect transistor. At the time of a turn-off operation of the transistor, the driving section applies, to a gate of the transistor, the off-voltage that is set in consideration of the off-leakage current between the source and the drain. This suppresses occurrence of noise or variation in dark level that are caused by the off-leakage current of the transistor and a dark current of the photoelectric converter device. As a result, it is possible to achieve high quality in pickup images.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the present disclosure, and are incorporated in and constitute a part of this specification. The drawings illustrate embodiments and, together with the specification, serve to explain the principles of the present technology.

DETAILED DESCRIPTION

Hereinafter, preferred embodiments of the present disclosure are described in detail with reference to the drawings. It is to be noted that the descriptions are provided in the order given below.
1. First Embodiment (an example of an image pickup unit that performs an image pickup operation by controlling an off-voltage (fixed value) of a transistor in such a manner that an off-leakage current is reduced)
2. Second Embodiment (an example of an image pickup unit that performs an image pickup operation by switching an off-voltage (variable value) of a transistor depending on a frame frequency)
3. Modification Example 1 (another example of a passive pixel circuit)
4. Modification Example 2 (another example of a passive pixel circuit)
5. Modification Examples 3 and 4 (examples of an active pixel circuit)
6. Modification Examples 5 and 6 (examples of an image pickup section that performs an image pickup operation based on a radiation ray)
7. Application Example (an example of an image pickup display system)

1. First Embodiment

[Configuration]

Figure 1:
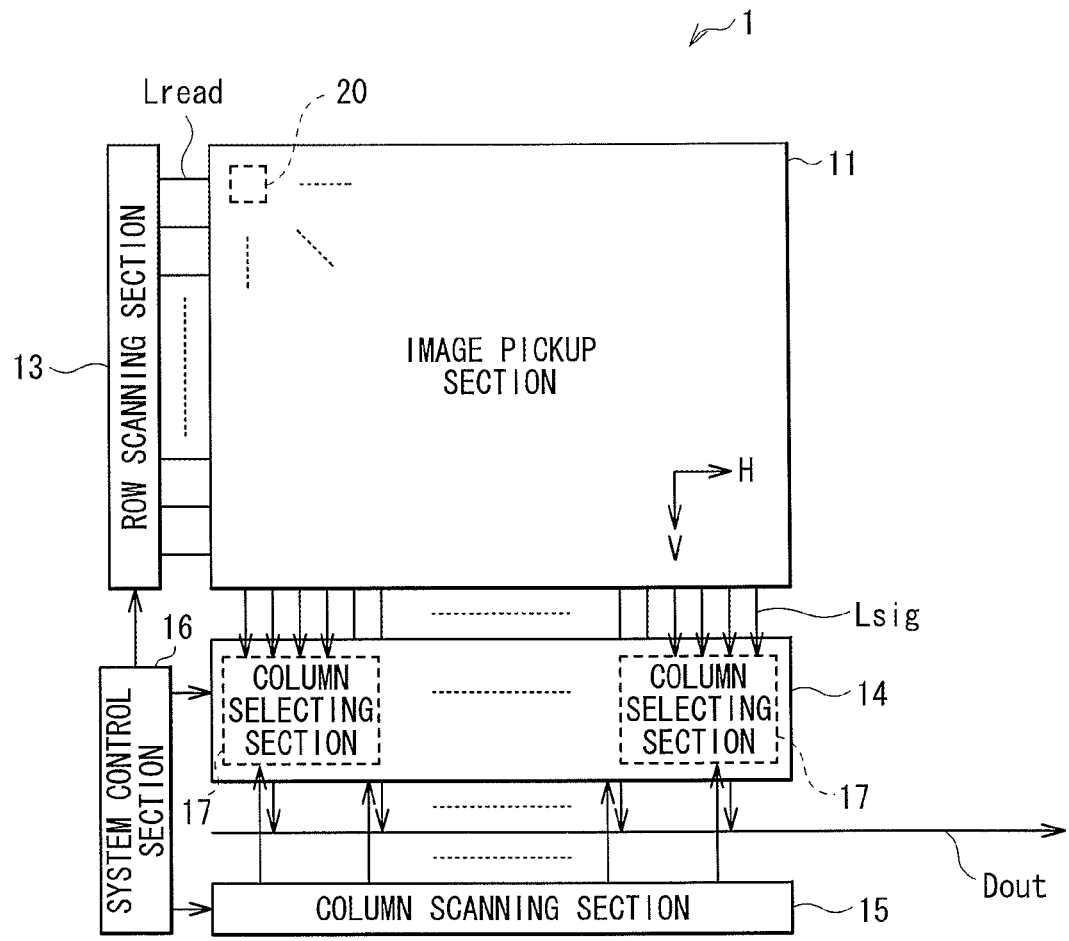
FIG. 1 is a block diagram showing an example of an overall configuration of an image pickup unit according to a first embodiment of the present disclosure.

FIG. 1 shows an overall block configuration of an image pickup unit (image pickup unit 1) according to a first embodiment of the present disclosure. The image pickup unit 1 reads information on a subject (takes an image of a subject) on the basis of incident light (image pickup light). The image pickup unit 1 includes an image pickup section 11, a row scanning section 13, an A/D (analog-to-digital) conversion section 14, a column scanning section 15, and a system control section 16. Among those sections, the row scanning section 13, the A/D conversion section 14, the column scanning section 15, and the system control section 16 correspond to specific but not limitative examples of "driving section" of the present disclosure.

(Image Pickup Section 11)

The image pickup section 11 generates electrical signals depending on incident light (image pickup light). In the image pickup section 11, pixels (image pickup pixels or unit pixels) 20 are arranged two-dimensionally in a row-column pattern (matrix pattern). Each of the pixels 20 has a photoelectric converter device (later-described photoelectric converter device 21) that generates a photoelectric charge of the charge amount according to the amount of the image pickup light to accumulate the resulting photoelectric charge internally. It is to be noted that the descriptions are provided hereinafter in such a manner that a horizontal direction (row direction) within the image pickup section 11 is called an "H" direction, and a vertical direction (column direction) is called a "V" direction as shown in FIG. 1.

Figure 2:
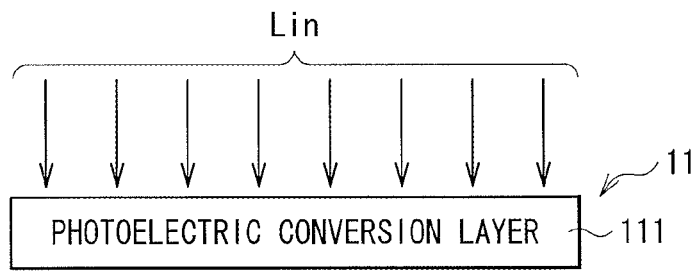
FIG. 2 is a schematic diagram showing an example of a simplified configuration of an image pickup section illustrated in FIG. 1.

FIG. 2 shows an example of a simplified configuration of the image pickup section 11. The image pickup section 11 has a photoelectric conversion layer 111 with a photoelectric converter device 21 arranged thereon for each of the pixels 20. In the photoelectric conversion layer 111, as shown in the drawing, a photoelectric conversion (conversion from image pickup light Lin into a signal charge) on the basis of the incident image pickup light Lin is carried out.

Figure 3:
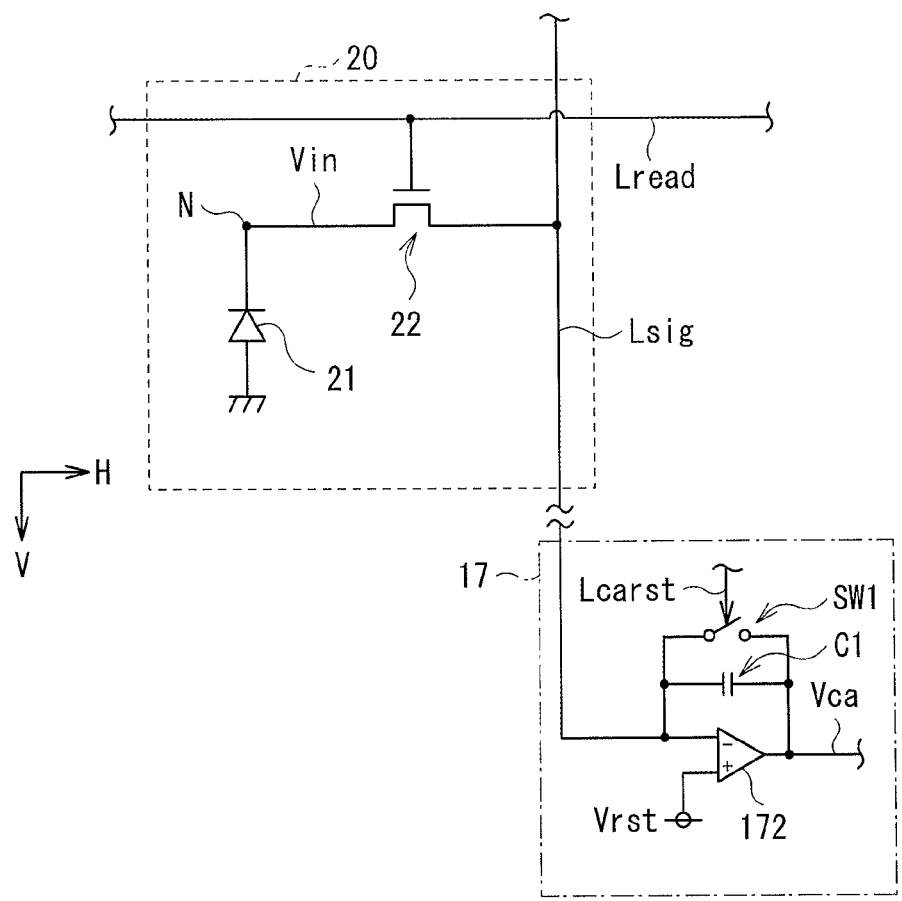
FIG. 3 is a circuit diagram showing an example of a detailed configuration of a pixel and the like illustrated in FIG. 1.

FIG. 3 shows an example of a circuit configuration of the pixel 20 (so-called passive circuit configuration) along with a circuit configuration of a later-described column selecting section 17 within the A/D conversion section 14. In this passive pixel 20, there are provided a single photoelectric converter device 21 and a single transistor 22. Further, a readout control line Lread extending along the H direction and a signal line Lsig extending along the V direction are also connected with this pixel 20.

The photoelectric converter device 21 is configured of a PIN (Positive Intrinsic Negative) type photodiode or an MIS (Metal-Insulator-Semiconductor) type sensor, for example, and generates a signal charge of the charge amount according to the amount of the incident light (image pickup light Lin) as described above. It is to be noted that a cathode of the photoelectric converter device 21 is connected with an accumulation node N in this case.

The transistor 22 is a transistor (readout transistor) that is turned on in response to a row scanning signal provided from the readout control line Lread, thereby outputting a signal charge (input voltage Vin) obtained by the photoelectric converter device 21 to the signal line Lsig. The transistor 22 is configured of an N-channel type (N-type) field-effect transistor (FET) in this case. However, the transistor 22 may be alternatively configured of a P-channel type (P-type) FET or the like. For a channel of the transistor 22, a silicon-based semiconductor such as amorphous silicon, microcrystalline silicon, or polycrystalline silicon (polysilicon) is used. Other than those materials, an oxide semiconductor such as indium gallium zinc oxide (InGaZnO) and zinc oxide (ZnO) may be used alternatively. In the pixel 20, a gate of the transistor 22 is connected with the readout control line Lread, and a source thereof is connected with the signal line Lsig, for example, while a drain thereof is connected with the cathode of the photoelectric converter device 21 via the accumulation node N, for example. Further, an anode of the photoelectric converter device 21 is connected with a ground (grounded) in this case.

A pulse voltage is applied to the gate of this readout transistor 22 through driving by the row scanning section 13, and a high-side voltage (on-voltage Von) thereof turns on the transistor 22, and a low-side voltage (off-voltage Voff) thereof turns off the transistor 22. In this embodiment of the present disclosure, the off-voltage Voff to be applied to the transistor 22 is a fixed value that is set in consideration of an off-leakage current between the source and the drain of the transistor 22. The details are hereinafter described.

(Row Scanning Section 13)

The row scanning section 13 includes, for example, a later-described shift register circuit, a predetermined logic circuit, and the like. The row scanning section 13 is a pixel driving section (row scanning circuit) that performs driving (line sequential scanning) in a unit of row (unit of horizontal line) for the plurality of pixels 20 within the image pickup section 11. Specifically, the row scanning section 13 performs an image pickup operation such as a later-described readout operation through line sequential scanning, for example. It is to be noted that such line sequential scanning is carried out by providing the above-described row scanning signal to each of the pixels 20 via the readout control line Lread.

Figure 4:
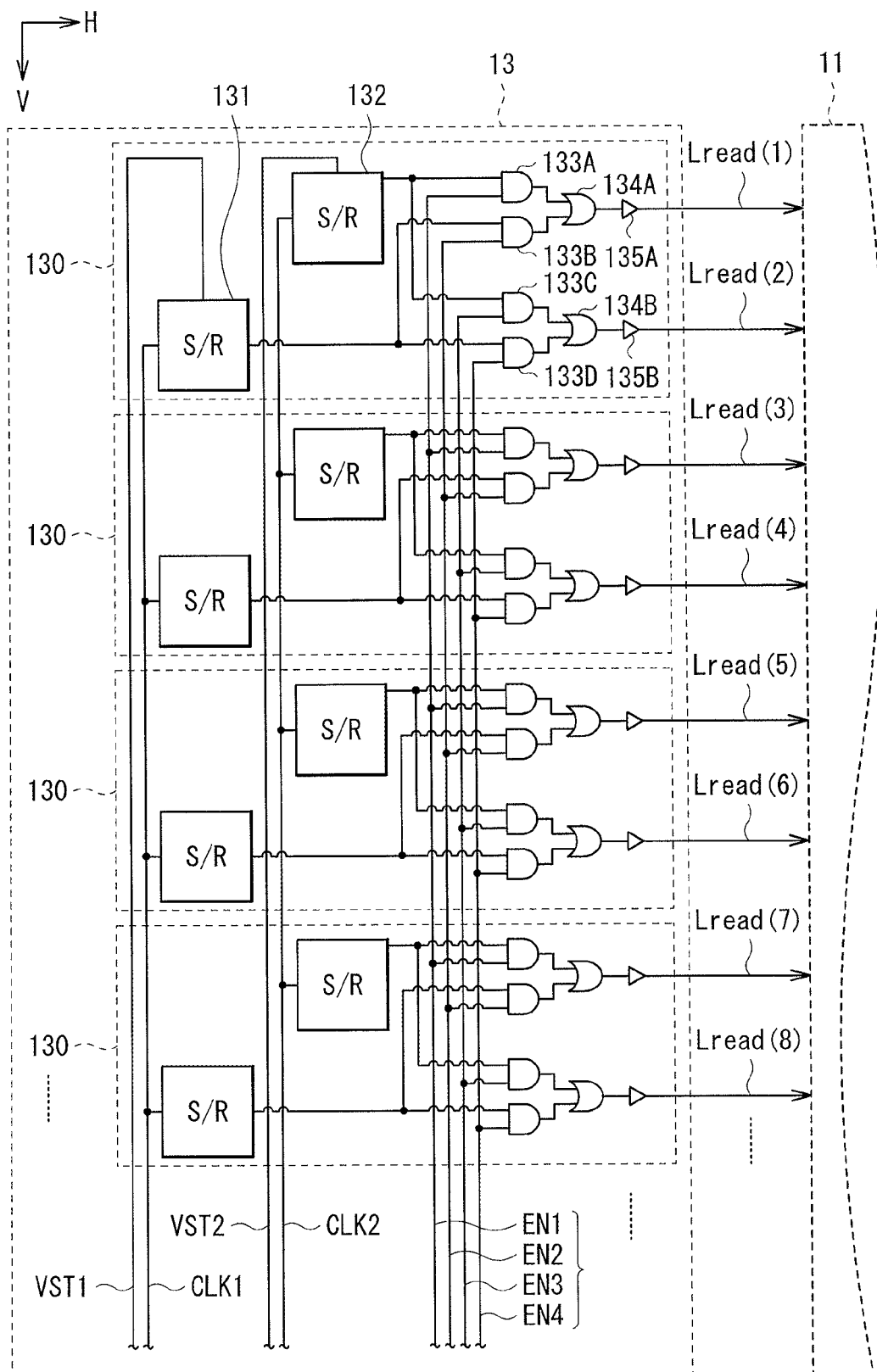
FIG. 4 is a block diagram showing an example of a detailed configuration of a row scanning section illustrated in FIG. 1.

FIG. 4 shows an example of a block configuration of the row scanning section 13. The row scanning section 13 has a plurality of unit circuits 130 extending along the V direction. It is to be noted that, in this example, eight readout control lines Lread that are connected with four unit circuits 130 shown in the drawing are indicated as Lread (1) through Lread (8), respectively, from the top.

Each of the unit circuits 130 has, for example, shift register circuits (denoted as "SIR" within a block in the drawing for the sake of convenience; the same is applicable to the rest of the drawings) 131 and 132 in one or more columns (two columns in this configuration), four AND circuits (logical product circuits) 133A to 133D, two OR circuits (logical sum circuits) 134A and 134B, and two buffer circuits 135A and 135B. Here, a configuration having the shift register circuits in two columns is described as an example. However, a configuration having the shift register circuits in a single column may be adopted alternatively. However, provision of the shift register circuits in two or more columns allows multiple number of times of reset operation to be performed during a single frame period, which is not described in detail.

The shift register circuit 131 is a circuit to generate pulse signals shifting toward the V direction sequentially across the plurality of unit circuits 130 as a whole on the basis of a start pulse VST1 and a clock signal CLK1 that are provided from the system control section 16. Similarly, the shift register circuit 132 is a circuit to generate pulse signals shifting toward the V direction sequentially across the plurality of unit circuits 130 as a whole on the basis of a start pulse VST2 and a clock signal CLK2 that are provided from the system control section 16. In such a manner, for example, the shift register circuit 131 generates a first-time reset driving pulse signal, and the shift register circuit 132 generates a second-time reset driving pulse signal.

Four types of enable signals EN1 to EN4 that each control (define) a valid period of each of pulse signals (output signals) that are output from the shift register circuits 131 and 132 are input to the AND circuits 133A to 133D, respectively. Specifically, in the AND circuit 133A, a pulse signal from the shift register circuit 132 is input to a first input terminal, and the enable signal EN1 is input to a second input terminal. In the AND circuit 133B, a pulse signal from the shift register circuit 131 is input to a first input terminal, and the enable signal EN2 is input to a second input terminal. In the AND circuit 133C, a pulse signal from the shift register circuit 132 is input to a first input terminal, and the enable signal EN3 is input to a second input terminal. In the AND circuit 133D, a pulse signal from the shift register circuit 131 is input to a first input terminal, and the enable signal EN4 is input to a second input terminal.

The OR circuit 134A is a circuit to generate a logical sum signal (OR signal) of an output signal from the AND circuit 133A and an output signal from the AND circuit 133B. Similarly, the OR circuit 134B is a circuit to generate a logical sum signal of an output signal from the AND circuit 133C and an output signal from the AND circuit 133D. Thus, the above-described AND circuits 133A to 133D and the OR circuits 134A and 134B generate a logical sum signal of the output signals (pulse signals) from the shift register circuits 131 and 132 while controlling a valid period of each output signal. This defines, for example, a drive timing and/or the like in performing reset driving several times.

The buffer circuit 135A is a circuit functioning as a buffer for an output signal (pulse signal) from the OR circuit 134A, and the buffer circuit 135B is a circuit functioning as a buffer for an output signal from the OR circuit 134B. After buffering by those buffer circuits 135A and 135B, the resultant pulse signals (row scanning signals) are output to each of the pixels 20 within the image pickup section 11 via the readout control line Lread.

(A/D Conversion Section 14)

The A/D conversion section 14 has a plurality of column selecting sections 17 that are each provided for a plurality of (four, in this example) signal lines Lsig. The A/D conversion section 14 carries out A/D conversion (analog-to-digital conversion) based on signal voltages (signal charges) incoming via the signal lines Lsig. This generates output data Dout (image pickup signal) in the form of a digital signal that is output to the outside.

Figure 5:
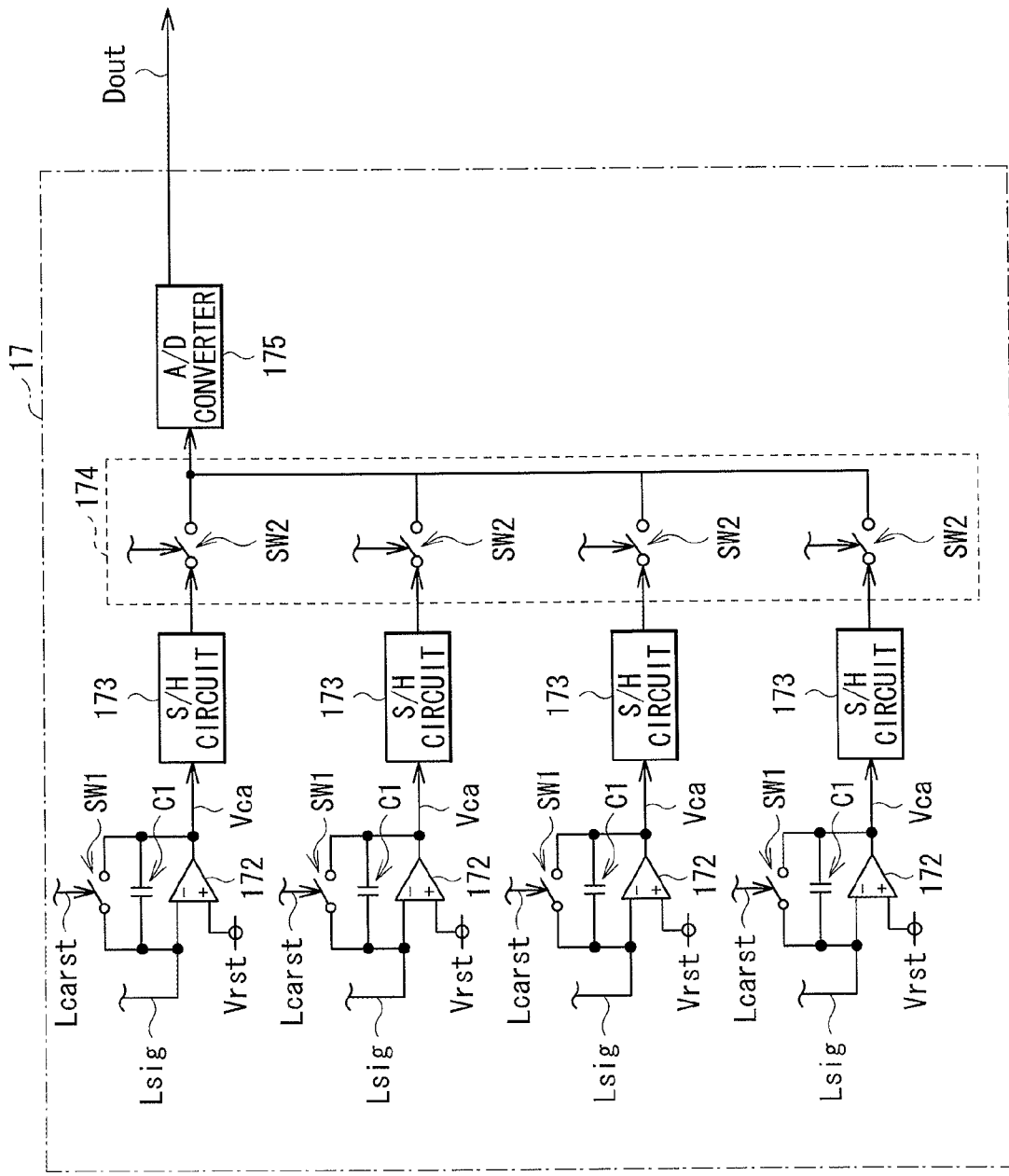
FIG. 5 is a block diagram showing an example of a detailed configuration of a column selecting section illustrated in FIG. 1.

As shown in FIG. 3 and FIG. 5, for example, each of the column selecting sections 17 has a charge amplifier 172, a capacitor device (condenser, feedback capacitor device) C1, a switch SW1, a sample-hold (S/H) circuit 173, a multiplexer circuit (selection circuit) 174 including four switches SW2, and an A/D (analog-to-digital) converter 175. Among these, the charge amplifier 172, the capacitor device C1, the switch SW1, the S/H circuit 173, and the switch SW2 are provided for each signal line Lsig. The multiplexer circuit 174 and the A/D converter 175 are provided for each column selecting section 17.

The charge amplifier 172 is an amplifier for converting a signal charge that is read out from the signal line Lsig into a voltage (Q-V conversion). In the charge amplifier 172, one end of the signal line Lsig is connected with a negative (minus-side) input terminal, and a predetermined reset voltage Vrst is applied to a positive (plus-side) input terminal. Between an output terminal and the negative input terminal of the charge amplifier 172, a feedback connection is made through a parallel connection circuit of the capacitor device C1 and the switch SW1. In other words, a first terminal of the capacitor device C1 is connected with the negative input terminal of the charge amplifier 172, and a second terminal is connected with the output terminal of the charge amplifier 172. Similarly, a first terminal of the switch SW1 is connected with the negative input terminal of the charge amplifier 172, and a second terminal is connected with the output terminal of the charge amplifier 172. It is to be noted that an on-off state of the switch SW1 is controlled with the use of a control signal (amplifier reset control signal) that is provided from the system control section 16 via an amplifier reset control line Lcarst.

The S/H circuit 173 is disposed between the charge amplifier 172 and the multiplexer circuit 174 (switch SW2). The S/H circuit 173 is a circuit for temporarily holding an output voltage Vca from the charge amplifier 172.

The multiplexer circuit 174 is a circuit for making connection or disconnection selectively between each of the S/H circuits 173 and the A/D converter 175 in such a manner that four switches SW2 are sequentially turned on one by one in accordance with a scan driving by the column scanning section 15.

The A/D converter 175 is a circuit that performs A/D conversion on an output voltage incoming from the S/H circuit 173 via the switch SW2 to generate and output the above-described output data Dout.

(Column Scanning Section 15)

The column scanning section 15 includes, for example, a shift register, an address decoder, and the like that are not shown in the drawing. The column scanning section 15 sequentially drives each of the switches SW2 within the above-described column selecting sections 17 while scanning each of the switches SW2. Through such selective scanning performed by the column scanning section 15, signals for the respective pixels 20 that are read out via the respective signal lines Lsig (above-described output data Dout) are sequentially output to the outside.

(System Control Section 16)

The system control section 16 controls operations of the row scanning section 13, the A/D conversion section 14, and the column scanning section 15. Sequentially, the system control section 16 has a timing generator to generate various timing signals (control signals) described above, and carries out driving control of the row scanning section 13, the A/D conversion section 14, and the column scanning section 15 on the basis of the various timing signals generated by this timing generator. Under control of the system control section 16, each of the row scanning section 13, the A/D conversion section 14, and the column scanning section 15 performs image pickup driving (line sequential image pickup driving) on the plurality of pixels 20 within the image pickup section 11, and the output data Dout is thereby obtained from the image pickup section 11.

[Functions and Effects]

In the image pickup unit 1 according to this embodiment of the present disclosure, when the image pickup light Lin comes into the image pickup section 11, the photoelectric converter device 21 within each of the pixels 20 converts the image pickup light Lin into a signal charge (photoelectric conversion). At this time, in the accumulation node N, voltage variation depending on a node capacitance occurs due to accumulation of signal charges generated by the photoelectric conversion. Specifically, when an accumulation node capacitance is Cs, and a generated signal charge is q, a voltage varies (decreases, in this case) by a value of (q/Cs) in the accumulation node N. In response to such a voltage variation, the input voltage Vin (voltage according to a signal charge) is applied to the drain of the transistor 22. When the transistor 22 is turned on in response to a row scanning signal provided from the readout control line Lread, this input voltage Vin is read out from the pixel 20 to the signal line Lsig.

The signal charges that have been read out are input to the column selecting sections 17 within the A/D conversion section 14 for each of a plurality of pixel columns (four pixel columns in this case) via the signal lines Lsig. On the column selecting section 17, first, a charge amplifier circuit configured of the charge amplifier 172 and the like performs Q-V conversion (signal-charge-to-signal-voltage conversion) on each of the signal charges incoming from each signal line Lsig. Next, the A/D converter 175 performs A/D conversion via the S/H circuit 173 and the multiplexer circuit 174 on each of the converted signal voltages (output voltages Vca from the charge amplifier 172), thereby generating the output data Dout (image pickup signal) in the form of a digital signal. In such a way, the output data Dout is output in sequence from each of the column selecting sections 17, and then, is transmitted to the outside (or is input to an internal memory that is not shown in the drawing). Hereinafter, this image pickup driving operation is described in detail.

Figure 6A:
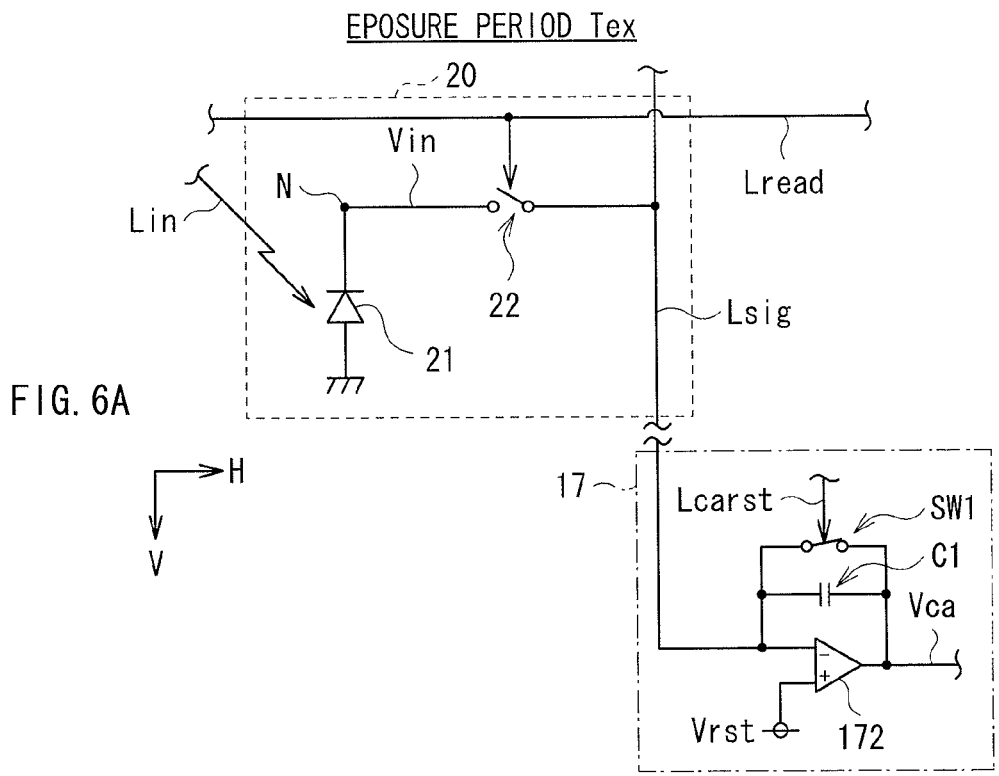
FIG. 6A is a circuit diagram showing an example of an operating state during an exposure period.
Figure 6B:
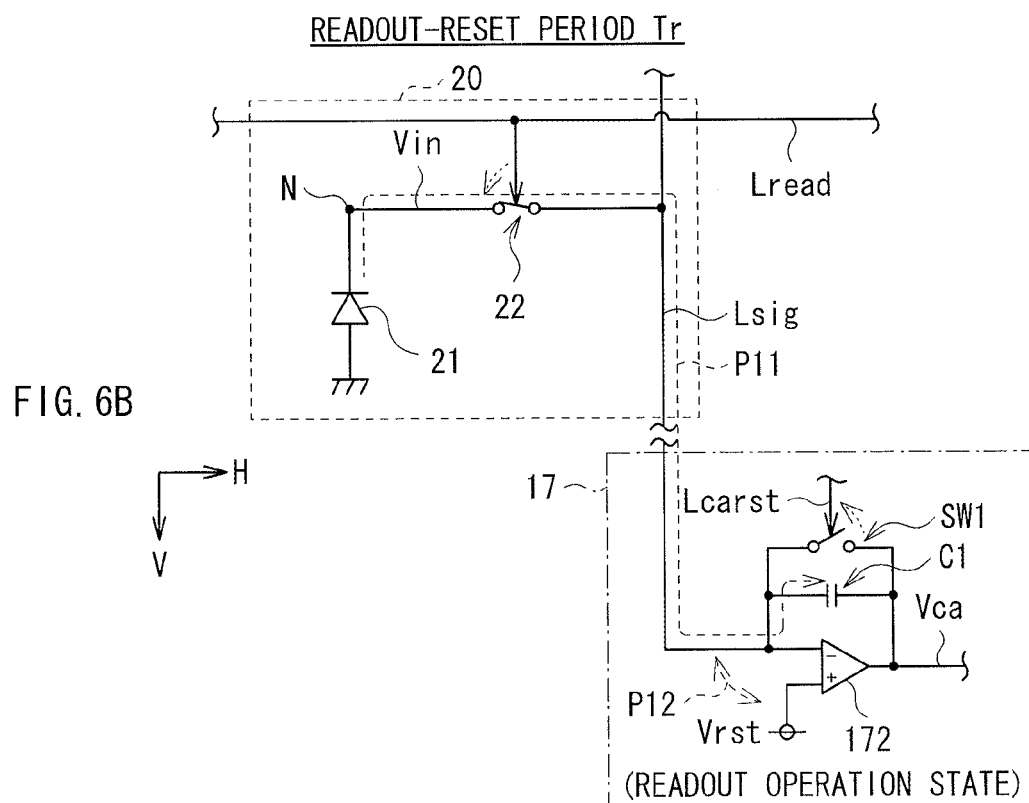
FIG. 6B is a circuit diagram showing an example of an operating state during a readout-reset period.

FIGS. 6A and 6B show operation examples of the pixel 20 and the charge amplifier circuit within the column selecting section 17 during an exposure period and a readout period. It is to be noted that the on-off state of the transistor 22 is hereinafter illustrated using a switch for the sake of explanatory convenience.

First, as shown in FIG. 6A, the transistor 22 is in an off state during the exposure period Tex. In this state, a signal charge based on the image pickup light Lin incoming into the photoelectric converter device 21 within the pixel 20 is accumulated in the accumulation node N, and is not output (read out) to the signal line Lsig side. On the other hand, the charge amplifier circuit is in a state after the later-described amplifier reset operation (reset operation of the charge amplifier circuit) is completed, and therefore, the switch SW1 is in an on state, resulting in a voltage-follower circuit being formed.

Subsequently, after this exposure period Tex, operation (readout operation) for reading the signal charges from the pixel 20 is carried out and an operation for resetting (discharging) the signal charges accumulated within the pixel 20 (reset operation, pixel reset operation) is carried out. In this embodiment of the present disclosure, the pixel 20 has a passive pixel circuit, and therefore, a reset operation is performed in association with the above-described readout operation. Hereinafter, the descriptions are provided in such a manner that a period when readout and reset are performed is referred to as a "readout-reset period Tr" or simply as a "period Tr".

Specifically, during the readout-reset period Tr, as shown in FIG. 6B, the transistor 22 becomes an on state, and the signal charges are read out from the accumulation node N within the pixel 20 to the signal line Lsig side (see an arrow mark P11 in the drawing). The signal charges that are read out in such a way are input to the charge amplifier circuit. However, the switch SW1 is in an off state in the charge amplifier circuit at this time (the charge amplifier circuit is in a readout operational state). Accordingly, the signal charges incoming into the charge amplifier circuit are accumulated in the capacitor device C1, and the signal voltage (output voltage Vca) according to the accumulated charges are output from the charge amplifier 172. It is to be noted that the charges accumulated in the capacitor device C1 are reset (amplifier reset operation is carried out) in such a manner that the switch SW1 becomes an on state at the time of the amplifier reset operation which will be described later.

During this readout-reset period Tr, in association with the above-described readout operation, a reset operation utilizing an imaginary short-circuiting phenomenon of the charge amplifier circuit (charge amplifier 172) is carried out as shown with an arrow mark P12 in the drawing. More specifically, due to the imaginary short-circuiting phenomenon, a voltage on the negative input terminal side (signal line Lsig side) of the charge amplifier 172 is made substantially equal to a reset voltage Vrst that is applied to the positive input terminal, and therefore, the accumulation node N also becomes the reset voltage Vrst. As described above, in this embodiment of the present disclosure using the passive pixel circuit, during the readout-reset period Tr, the accumulation node N is reset to the predetermined reset voltage Vrst in association with the readout operation of the signal charges. It is to be noted that such a readout operation is performed in a line sequential manner on each of the readout control lines Lread.

Figure 7:
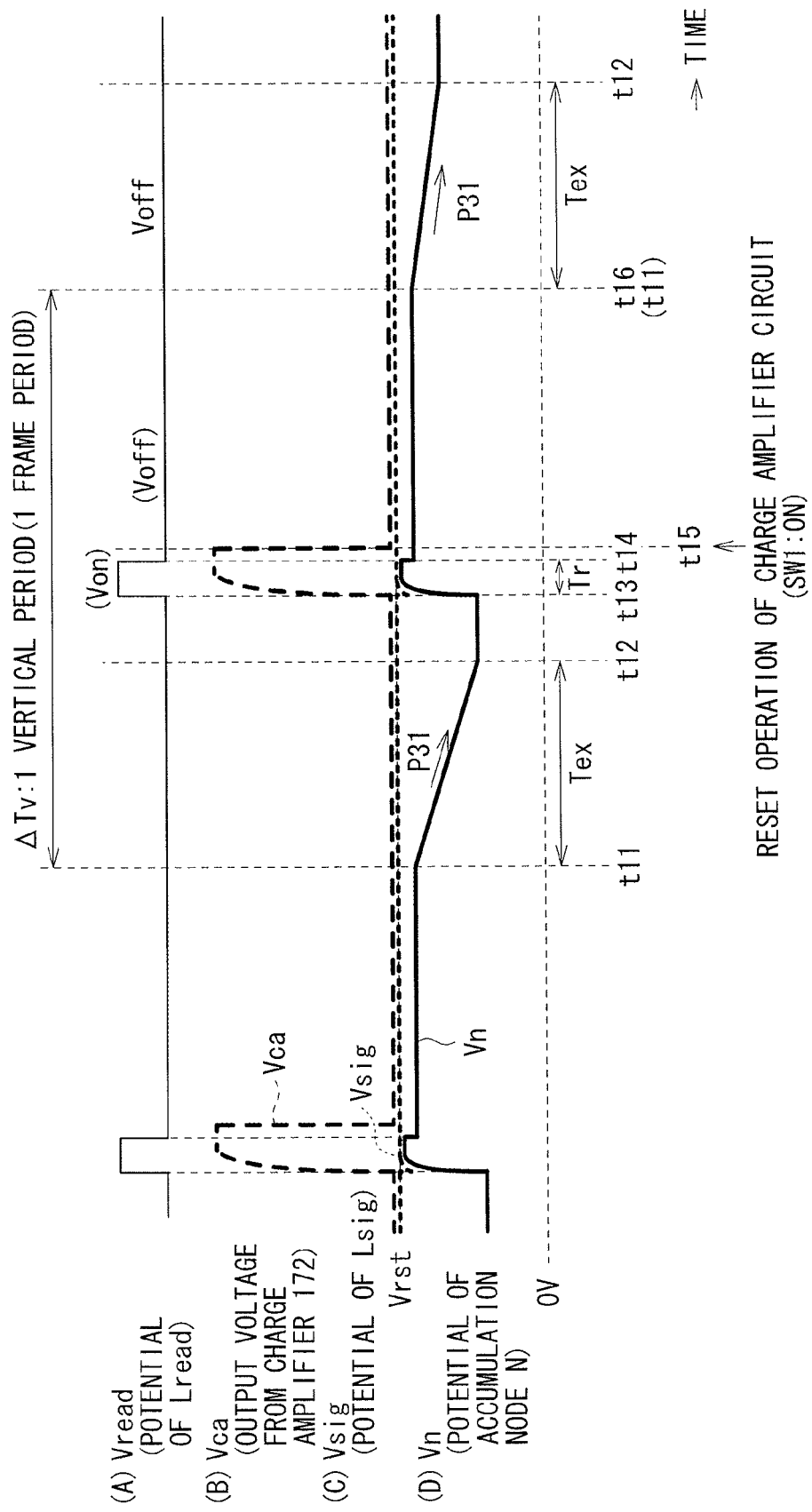
FIG. 7 is a timing waveform diagram for explaining an example of an image pickup driving operation.

Here, Parts (A), (B), (C), and (D) of FIG. 7 each show a timing waveform of each potential at the time of the image pickup driving operation as described above. Part (A) of FIG. 7 shows a timing waveform for a potential Vread of the readout control line Lread, Part (B) shows a timing waveform for the output voltage Vca from the charge amplifier 172, Part (C) shows a timing waveform for a potential Vsig of the signal line Lsig, and Part (D) shows a timing waveform for a potential Vn of the accumulation node N. It is to be noted that each part of the drawing illustrates only periods before and after the image pickup driving operation for a single line including a single frame period ΔTv.

During a single frame period ΔTv, exposure operation is first performed as described above (FIG. 6A) during the exposure period Tex (timing t11 to timing t12). As a result, the photoelectric converter device 21 within the pixel 20 converts the incident image pickup light Lin into a signal charge (photoelectric conversion). This signal charge is accumulated in the accumulation node N, which gradually changes the potential Vn of the accumulation node N (P31 in Part (D) of FIG. 7). Here, a cathode of the photoelectric converter device 21 is connected with the accumulation node N, and therefore, the potential Vn decreases gradually from the reset voltage Vrst side toward 0 V during the exposure period Tex.

Subsequently, during the readout-reset period Tr (timing t13 to timing t14), the readout operation and the reset operation are carried out as described above. Specifically, an on-voltage Von is applied to the gate of the transistor 22 via the readout control line Lread (switching is performed from an off-voltage Voff to an on-voltage Von), which turns on the transistor 22. Thereafter, at a timing t14, an off-voltage Voff is applied to the gate of the transistor 22 via the readout control line Lread (switching is performed from an on-voltage Von to an off-voltage Voff), which turns off the transistor 22. It is to be noted that the on-voltage Von is a voltage capable of switching the transistor 22 from an off state to an on state, and is a high-side voltage (for example, a positive potential) in a voltage pulse. The off-voltage Voff is a voltage capable of switching the transistor 22 from an on state to an off state, and is a low-side voltage (for example, a negative potential) in a voltage pulse. Further, at a subsequent timing t15, the switch SW1 in the charge amplifier circuit becomes an on state, which resets the charges accumulated in the capacitor device C1 within the charge amplifier circuit (amplifier reset operation is performed).

(Control of Off-Voltage Voff)

In this embodiment of the present disclosure, as described above, the on/off state of the transistor 22 is switched by alternately switching two values of an on-voltage Von and an off-voltage Voff. However, the off-voltage Voff of the both voltages is set in consideration of the off-leakage current. It is to be noted that, here, the off-leakage current refers to a leakage current flowing between a source and a drain in an off state of the transistor 22 (hereinafter, simply referred to as "off-leakage current"). Further, in this embodiment of the present disclosure, unlike a second embodiment of the present disclosure to be described later, a value of the off-voltage Voff to be applied to the transistor 22 is a fixed value that is set to reduce the off-leakage current (more specifically, off-leakage current during a transitional period immediately after a turn-off operation). Such control is effective especially when a frame frequency (frame rate) is constant (fixed value) at the time of video shooting (or continuous shooting, the same is applicabpe in the description below).

Figure 8:
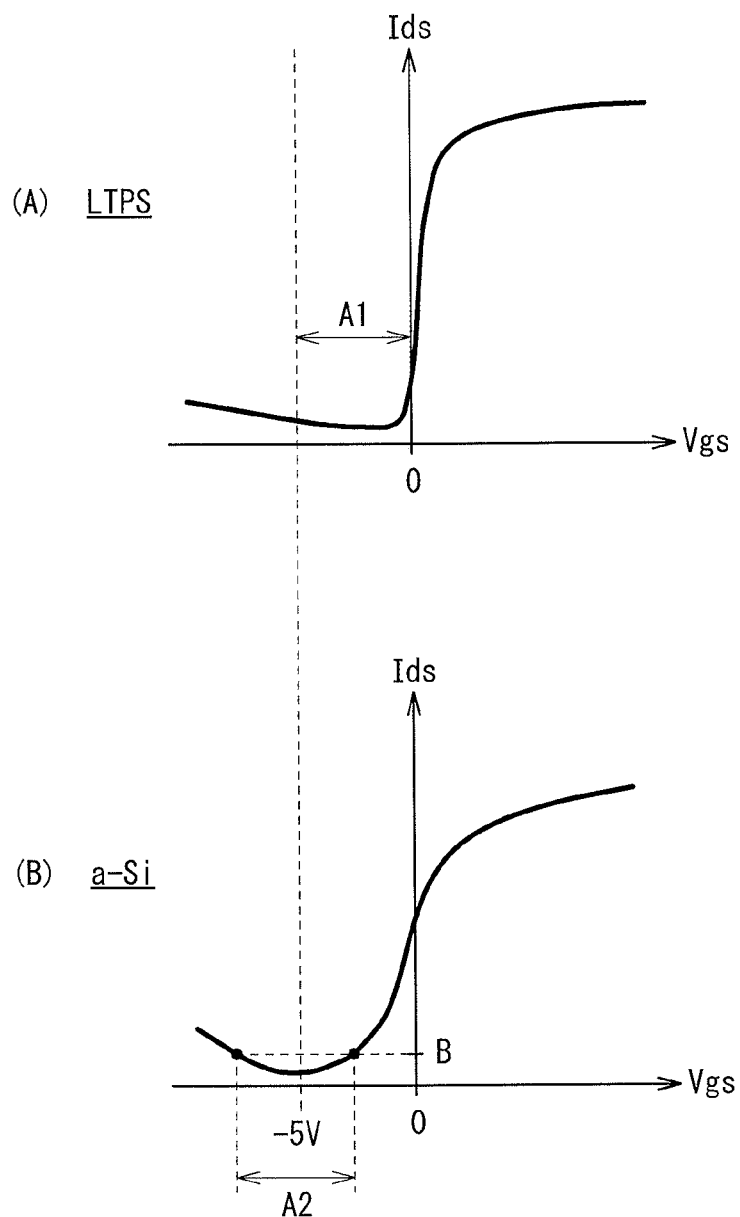
FIG. 8 is a diagram for explaining an off-voltage control range in cases of using low-temperature polysilicon and of using amorphous silicon.

A setting range of such an off-voltage Voff differs depending on semiconductor materials in use for channels of the transistor 22. As described above, a variety of semiconductor materials are used for the transistor 22. However, each setting range in the cases of using low-temperature polysilicon (LTPS) and of using amorphous silicon is described as an example. Part (A) of FIG. 8 shows the current-voltage characteristics in the case of using the low-temperature polysilicon, and Part (B) of FIG. 8 shows the current-voltage characteristics in the case of using the amorphous silicon. In this regard, a current Ids is a current between a source and a drain, and voltage Vgs is a voltage between a gate and a source.

As shown in part (A) of FIG. 8, for example, in the transistor 22 using the low-temperature polysilicon, when the voltage Vgs is negative (Vgs<0), the current Ids takes its minimum value in the vicinity of the voltage Vgs at approximately 0 V, and rises moderately as the voltage Vgs decreases. Therefore, in the case of using the low-temperature polysilicon, it is desirable to set the off-voltage Voff within a range A1 of approximately −5 V or more and less than approximately 0 V. Further, it is more desirable to set the off-voltage Voff at approximately −3.5 V or more. From the viewpoint of reducing the off-leakage current, it is ideal to set the off-voltage Voff at a value around approximately 0 V at which the current Ids becomes minimum. Although the details are hereinafter described, one reason for this is that a transient leakage current arising immediately after a turn-off operation of the transistor 22 has a tendency to become smaller as a value of the off-voltage Voff increases, and to become larger as a value of off-voltage Voff decreases.

On the other hand, as shown in Part (B) of FIG. 8, in the transistor 22 using the amorphous silicon, when the voltage Vgs is negative (Vgs<0), the current Ids takes its minimum value in the vicinity of the voltage Vgs at approximately −5 V. Therefore, in the case of using the amorphous silicon, unlike the case of using the low-temperature polysilicon, a preferred setting range of the off-voltage Voff is limited to a region in the vicinity of approximately −5 V. In other words, a setting range of the off-voltage Voff in the case of using the amorphous silicon is within a range A2 where the current Ids becomes a predetermined threshold B or less, for example.

(Influence of Occurrence of Leakage Current on Image Quality)

Figure 9:
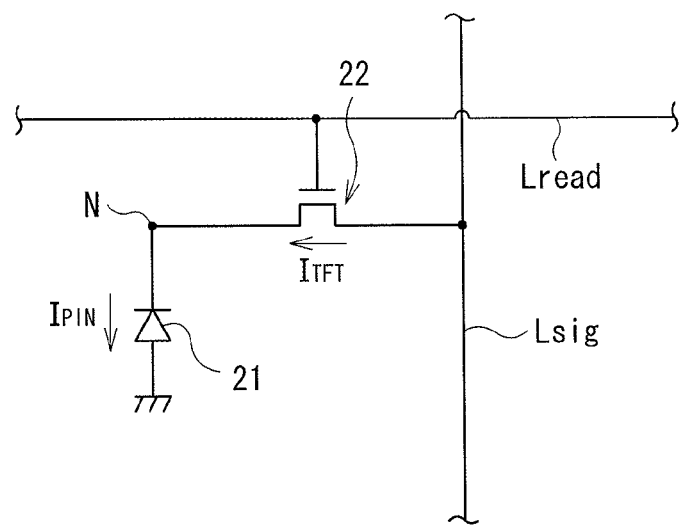
FIG. 9 is a circuit diagram for explaining an off-leakage current and a dark current after a turn-off operation of a transistor.

Here, in an off state of the transistor 22, during a period of an interval from the end of a readout operation until the start of a readout operation of the next frame (period from a timing t14 to a timing t13 for the next frame), an off-leakage current $I_{TFT}$ arises in the transistor 22, and a dark current $I_{PIN}$ arises in the photoelectric converter device 21 as shown in FIG. 9. It is to be noted that the dark current $I_{PIN}$ arises during the exposure period Tex as well, and therefore, a current of sum of the dark current $I_{PIN}$ and light current (not shown in FIG. 9) flows through the photoelectric converter device 21 during the exposure period Tex. As a result, the accumulation node N is influenced by the off-leakage current $I_{TFT}$ and the dark current $I_{PIN}$, which causes a potential variation.

Figure 10:
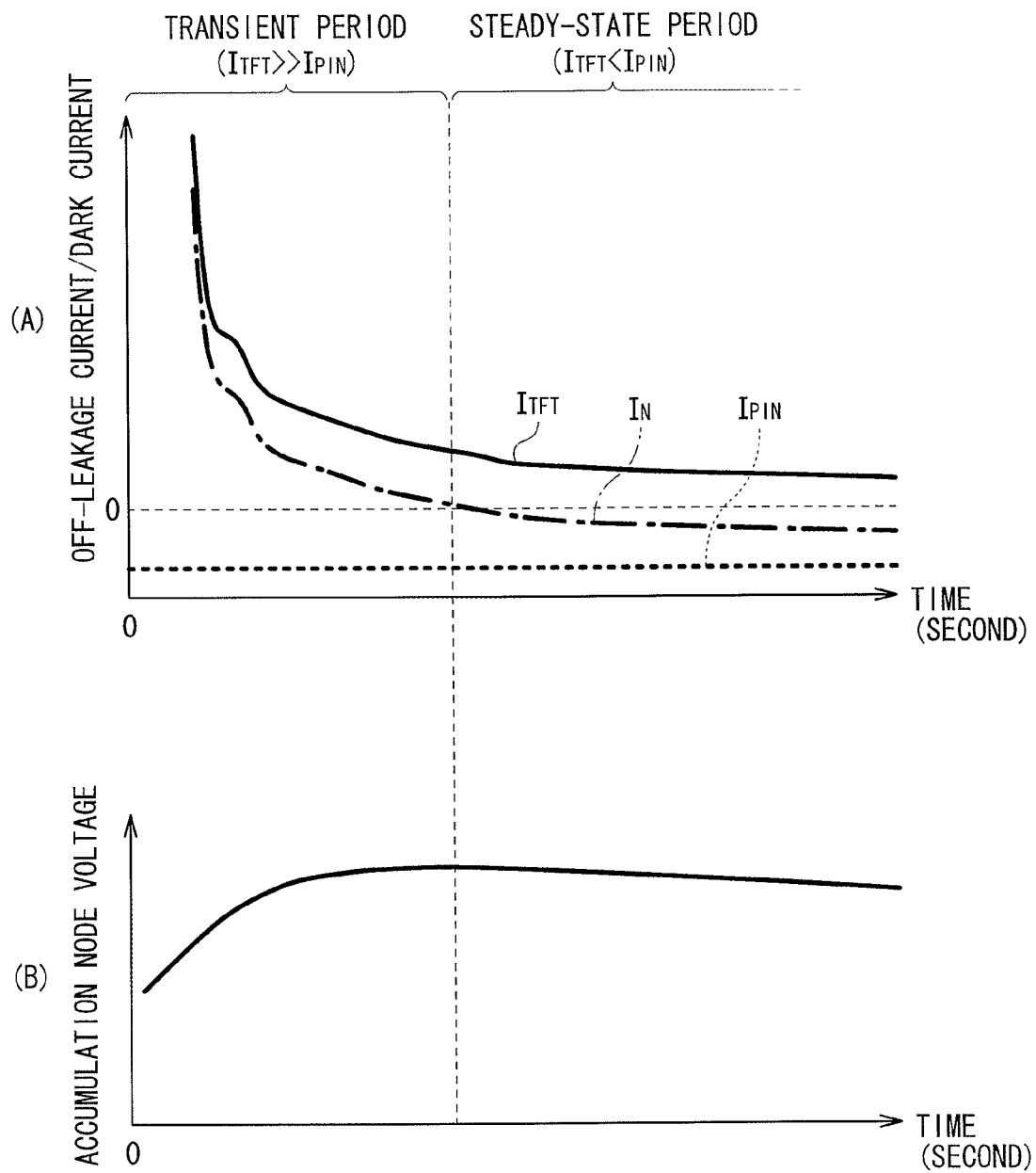
FIG. 10 is a characteristic diagram for explaining an influence of an off-leakage current on an accumulated node voltage.

Part (A) of FIG. 10 shows a measurement result of a change over time each for the off-leakage current $I_{TFT}$ and the dark current $I_{PIN}$ after the turn-off operation of the transistor 22. It is to be noted that this measurement result is obtained when the low-temperature polysilicon is used for the channels of the transistor 22. Further, with the accumulation node N specified as a reference (0 (zero)), a current flowing toward a direction heading for the accumulation node N (off-leakage current $I_{TFT}$, in this example) is indicated as a positive value (>0), and a current flowing toward a direction leaving the accumulation node N (dark current $I_{PIN}$, in this example) is indicated as a negative value (<0).

As described above, the dark current $I_{PIN}$ (dashed line) remains in an almost constant value over time after a turn-off operation. On the other hand, in the off-leakage current $I_{TFT}$ (solid line), a period from immediate completion of the turn-off operation until a predetermined timing (period of approximately 0 to 2 or 3 seconds) is a transient period when a rapid change in current values takes place, and after elapse of the transient period, a steady-state period with less variation comes. There is a tendency that the off-leakage current $I_{TFT}$ (transient off-leakage current) is extremely larger than the dark current $I_{PIN}$ ($I_{TFT} \gg I_{PIN}$) during the transient period, whereas the dark current $I_{PIN}$ is larger than the off-leakage current $I_{TFT}$ ($I_{TFT} < I_{PIN}$) during the steady-state period. Therefore, a current $I_N$ flowing through the accumulation node N (chain line) is influenced by a behavior of the off-leakage current $I_{TFT}$ to change (decrease) rapidly during the transient period, and is kept almost constant during the steady-state period. As a result, the accumulation node voltage (potential Vn of the accumulation node N) exhibits a behavior as shown in Part (B) of FIG. 10.

In other words, the potential Vn of the accumulation node N after a reset operation varies especially due to the influence of the off-leakage current $I_{TFT}$ during the transient period out of the off-leakage current $I_{TFT}$ and the dark current $I_{PIN}$. This causes a shot noise in an image signal. As described above, the off-leakage current $I_{TFT}$ arising during the transient period is a factor causing the quality of a pickup image to deteriorate.

Figure 11:
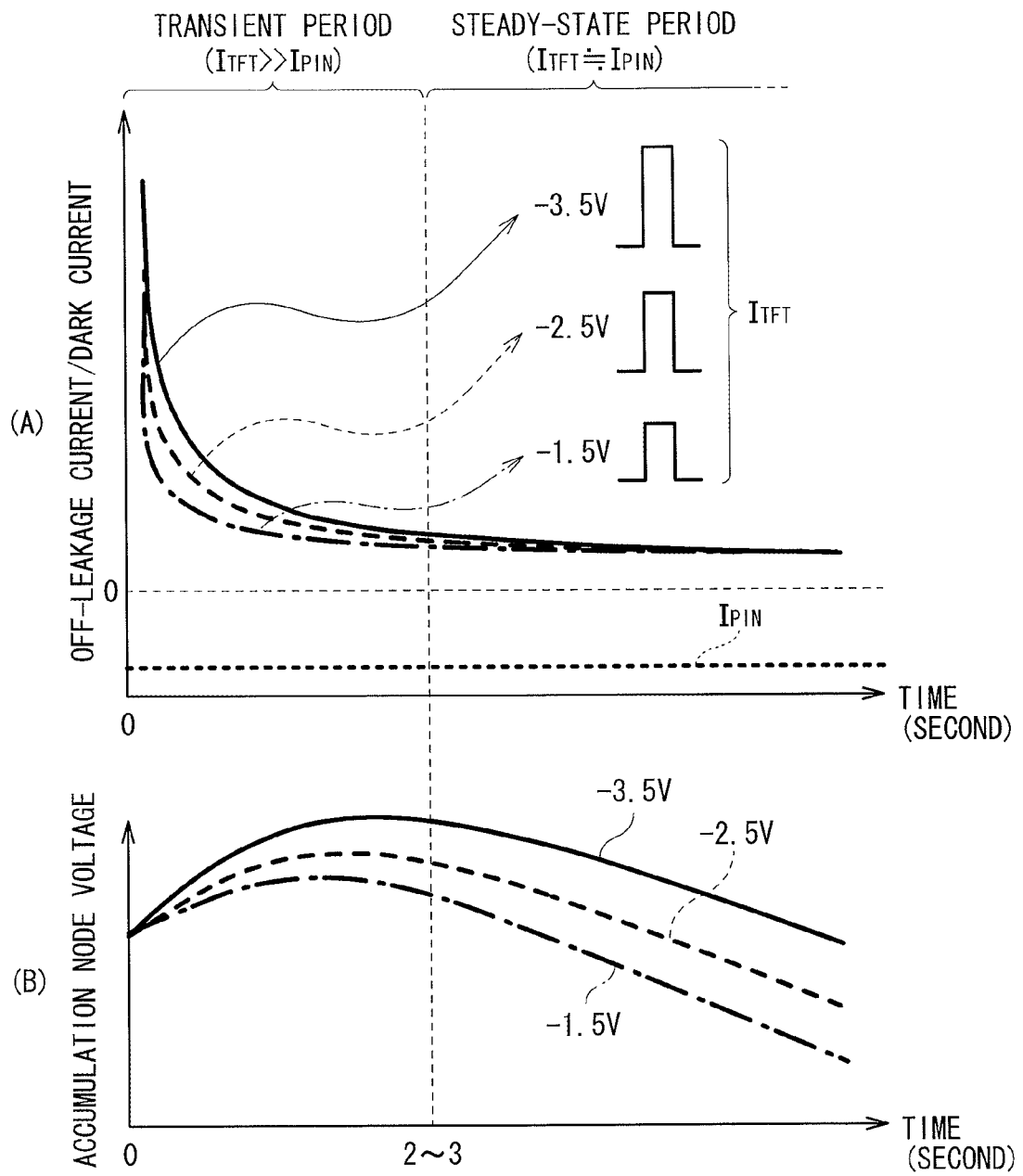
FIG. 11 is a characteristic diagram showing a change over time in the off-leakage current and the dark current and a change over time in the accumulated node voltage, according to the first embodiment of the present disclosure.

Accordingly, in this embodiment of the present disclosure, at the time of the turn-off operation of the transistor 22, the off-voltage Voff is controlled as described above. Here, as an example, Part (A) of FIG. 11 shows a change over time each for the off-leakage current $I_{TFT}$ and the dark current $I_{PIN}$ when a voltage value of the off-voltage Voff is approximately set at −3.5 V, −2.5 V, and −1.5 V. As seen from the drawing, the off-leakage current $I_{TFT}$ during the transient period becomes relatively smaller at a voltage value of approximately −1.5 V, and becomes relatively larger at a voltage value of approximately −3.5 V. In other words, it is possible to make the off-leakage current $I_{TFT}$ during the transient period smaller as a value of the off-voltage Voff is raised (is put closer to approximately 0 V). As shown in an example in Part (B) of FIG. 11, this suppresses a change in the accumulation node voltage. In this case, when the off-voltage Voff is approximately −1.5 V, a change in the accumulation node voltage is suppressed most effectively.

Therefore, utilizing a relationship between the off-leakage current $I_{TFT}$ and the off-voltage Voff as described above, the off-voltage Voff is set in consideration of the off-leakage current $I_{TFT}$ (in order to reduce the off-leakage current $I_{TFT}$ during the transient period in this embodiment of the present disclosure). This suppresses a change in the accumulation node voltage.

Further, a control operation of the off-voltage Voff in this embodiment of the present disclosure is effective especially when a frame frequency is constant (invariable) at the time of video shooting. One reason for this is that, when a frame frequency is constant, the necessity for considering a drift of pixel values is alleviated, which allows the off-voltage Voff to be set at a value further closer to 0 V to reduce the off-leakage current. It is to be noted that a drift of pixel values is a phenomenon that the amount of charges accumulated in the pixels varies over time (a dark level varies) due to the off-leakage current $I_{TFT}$ and the dark current $I_{PIN}$ irrespective of exposure being not performed. Here, when the frame frequency is variable, like a second embodiment of the present disclosure to be described later, it is desirable to adjust this dark level to be constant between frames. On the contrary, when the frame frequency is constant, the necessity for considering any change in the dark level between the frames is alleviated, which makes it possible to set the off-voltage Voff from a viewpoint of the off-leakage current as described above.

In particular, when the low-temperature polysilicon is used for the channels of the transistor 22, it is possible to set the off-voltage Voff at a value closer to 0 V within a range of approximately −5 V or more and less than approximately 0 V, and preferably within a range of approximately −3.5 V or more and less than approximately 0 V. As compared with the case of using the amorphous silicon, for example, this effectively reduces the off-leakage current $I_{TFT}$ during the transient period, which makes it easy to suppress occurrence of a shot noise in an image signal.

As described above, in this embodiment of the present disclosure, photoelectric conversion based on the incident light is carried out in each of the pixels 20 in the image pickup section 11, signal charges are read out to obtain image signals, and thereby, pickup images based on the incident light are obtained. At the time of the turn-off operation of the transistor 22 for signal reading, the row scanning section 13 applies the off-voltage Voff that is set in consideration of the off-leakage current $I_{TFT}$ thereof to the transistor 22. This reduces a noise arising due to the off-leakage current $I_{TFT}$ and the dark current $I_{PIN}$ of the photoelectric converter device 21. As a result, it is possible to achieve high quality in pickup images.

Next, the descriptions are provided on another embodiment (second embodiment) that is different from the first embodiment of the present disclosure. It is to be noted that components same as those in the above-described first embodiment of the present disclosure are denoted with the same reference numerals, and the related descriptions are omitted as appropriate.

Second Embodiment

Figure 12:
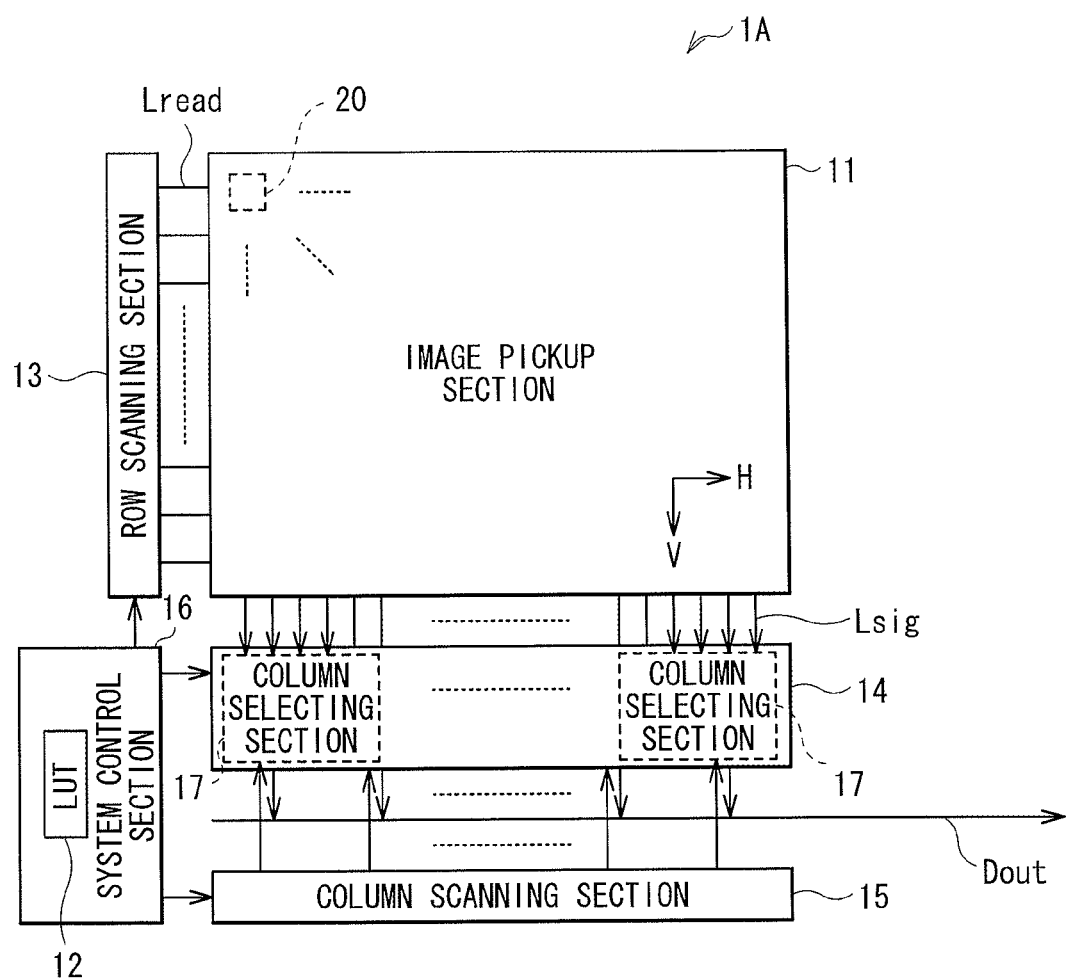
FIG. 12 is a block diagram showing an example of an overall configuration of an image pickup unit according to a second embodiment of the present disclosure.

FIG. 12 shows an overall block configuration of an image pickup unit (image pickup unit 1A) according to the second embodiment of the present disclosure. As with the image pickup unit 1 according to the above-described first embodiment, the image pickup unit 1A reads information on a subject on the basis of incident light (image pickup light), and includes an image pickup section 11, a row scanning section 13, an A/D conversion section 14, a column scanning section 15, and a system control section 16. However, the image pickup unit 1A according to the present embodiment performs video shooting by switching a plurality of frame frequencies, and carries out a turn-off operation of the transistor 22 using an off-voltage Voff corresponding to each frame frequency. That is, in this embodiment of the present disclosure, unlike the above-described first embodiment, a value of the off-voltage Voff is variable depending on the frame frequency.

Specifically, in the image pickup unit 1A, any frame frequency is set up from among the plurality of frame frequencies automatically or on the basis of an external input signal, and signal charges are read out at a drive timing corresponding to the set frame frequency. Therefore, in this embodiment of the present disclosure, for example, the system control section 16 includes an LUT (Lookup Table) 12, on which a plurality of values of the off-voltage Voff (voltage values Voff(1) to Voff(n)) are held corresponding to each of the plurality of frame frequencies (f1 to fn) (n is an integer of 2 or more). It is to be noted that the LUT 12 may be alternatively provided at the outside of the system control section 16. Each of such voltage values of the off-voltage Voff is stored in the LUT 12 in the following procedures, for example, and thereafter, an appropriate voltage value is selected to be used depending on the frame frequency.

Figure 13:
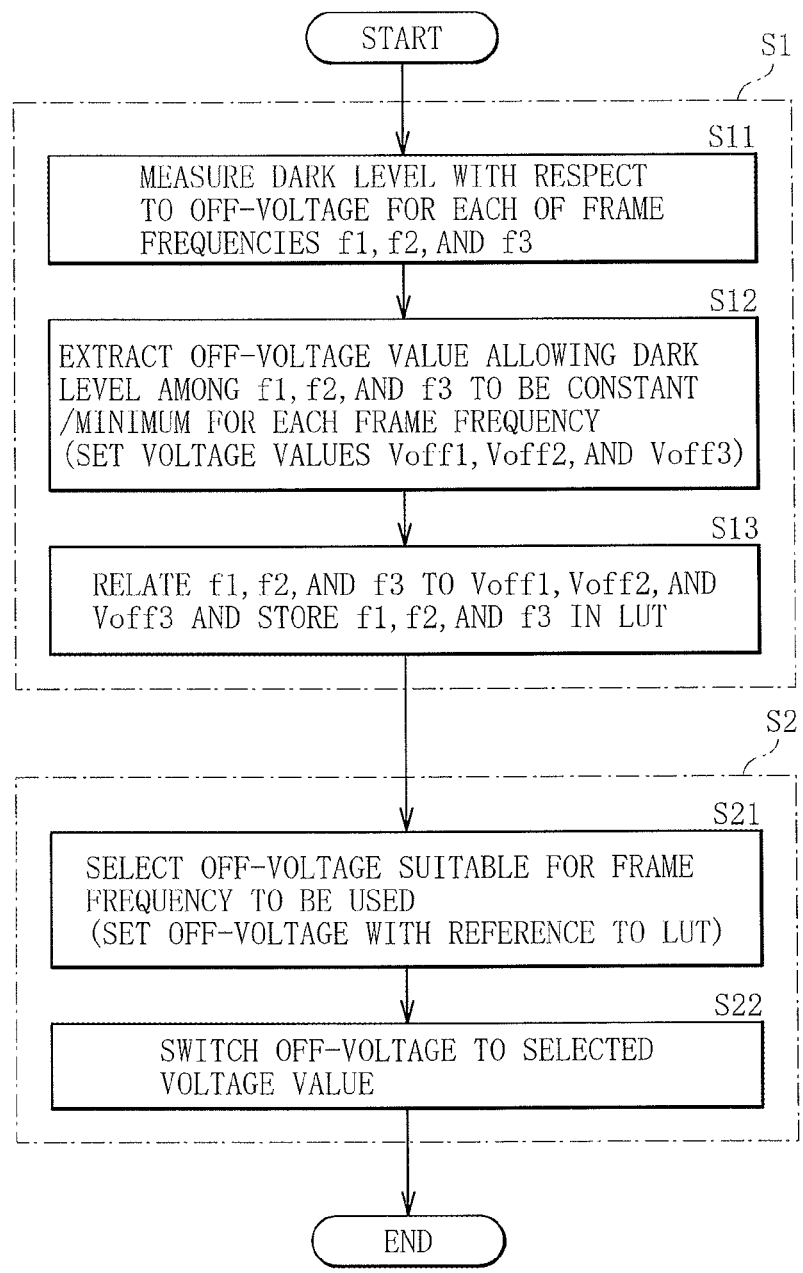
FIG. 13 is a flow chart showing a processing flow of an off-voltage setting operation and switching operation.

FIG. 13 is a flow chart of a setting step S1 and a switching step S2 for each of the voltage values of the off-voltage Voff. Out of these steps, the setting step S1 is carried out in advance, prior to shipment of the image pickup unit 1A, and the switching step S2 is performed at a timing according to a switching timing of the frame frequency at the time of video shooting.

More specifically, first, as the setting step S1, in each of the (switchable) frame frequencies (f1 to fn) to be used, a dark level DL (equivalent to a difference between the charge amount of the off-leakage current $I_{TFT}$ and the charge amount of the dark current $I_{PIN}$) with respect to the off-voltage Voff is measured. It is to be noted that the description is provided here assuming a case where three frame frequencies f1 (30 fps), f2 (15 fps), and f3 (7.5 fps) are switched to be used as an example.

Figure 14:
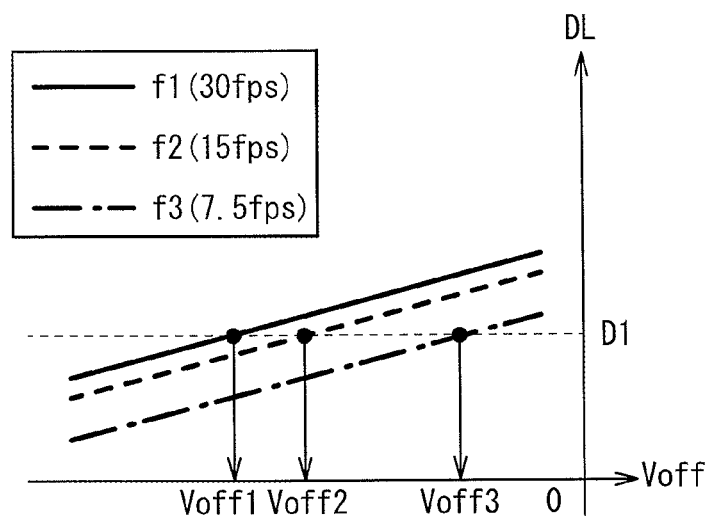
FIG. 14 is a schematic diagram for explaining an off-voltage setting operation.

For example, as shown in FIG. 14, in each of the frame frequencies f1 to f3, the dark level DL at the time when a value of the off-voltage Voff is varied is measured (step S11). Subsequently, based on this measurement result, each of the off-voltage Voff values (Voff(1) to Voff(3)) allowing the dark level DL to be a constant value D1 is obtained among each case of frame frequencies f1 to f3 (step S12). Use of the voltage values (Voff(1) to Voff(3)) that are obtained in such a manner makes it possible to suppress a variation in the dark level between the frames in the event of a variation in the frame frequency. At this time, it is more desirable to make a setting in such a manner that the above-described value D1 becomes the minimum. This makes it possible to suppress a variation in the dark level as described above, as well as to reduce a noise.

Subsequently, the voltage values (Voff(1) to Voff(3)) that are obtained in the above-described manner are stored in the LUT 12 along with the corresponding frame frequencies f1 to f3 (step S13). Specifically, the voltage values Voff(1), Voff(2), and Voff(3) are related to the frame frequencies f1, f2, and f3, respectively, and are stored in the LUT 12. As described above, each of the off-voltage Voff values that are preferred for each of the plurality of frame frequencies to be used at the time of video shooting is set.

Thereafter, at the time of shooting, when the turn-off operation of the transistor 22 is performed, the off-voltage Voff of a voltage value corresponding to the frame frequency to be used is put to use. In switching the frame frequency, the off-voltage value corresponding to the frame frequency to be used after the switching is selected (step S21). More specifically, in the event of switching from the frame frequency f1 to the frame frequency f2, for example, with reference to the LUT 12, the voltage value Voff(2) corresponding to the frame frequency f2 after the switching is selected.

Afterward, the off-voltage Voff is switched to the selected voltage value (step S22). Specifically, in the event of switching from the frame frequency f1 to the frame frequency f2, for example, the off-voltage Voff value is switched from the voltage value Voff(1) to the voltage value Voff(2).

Figure 15A:
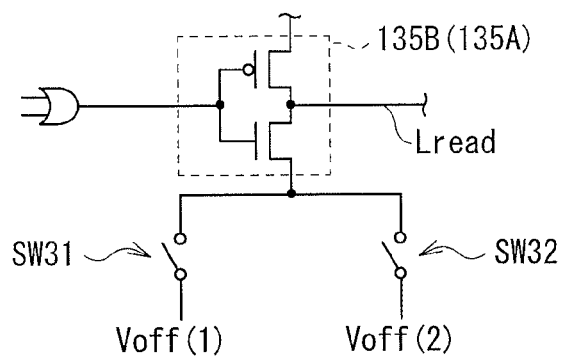
FIGS. 15A and 15B are each a circuit diagram showing an example of a configuration of a buffer circuit.
Figure 15B:
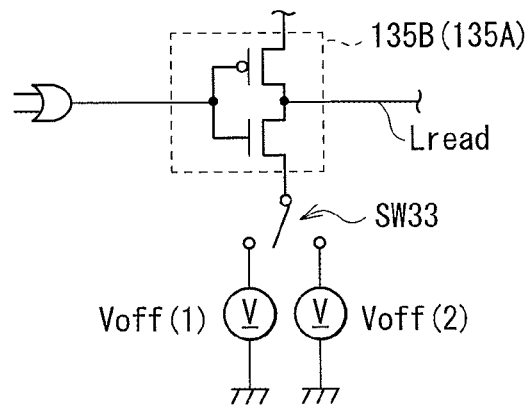

It is to be noted that switching of the off-voltage Voff is achievable by allowing the buffer circuits 135A and 135B in the row scanning section 13 (FIG. 4) to have circuit configurations as shown in FIGS. 15A and 15B, for example. For example, in switching the plurality of (for instance, two) voltage values Voff(1) and Voff(2), as shown in FIG. 15A, it is possible to achieve such switching by adopting a configuration utilizing switches (switches SW31 and SW32). More specifically, at the inside of the image pickup unit 1A, the switches SW31 and SW32 are provided at a low-side of the buffer circuit 135A (135B). One of these switches SW31 and SW32 is held in an on state, and the other is held in an off state. This allows the off-voltage Voff to be switched. Alternatively, as shown in FIG. 15B, a switch SW33 may be provided at the outside of the image pickup unit 1A to switch two values (Voff(1) and Voff(2)) at the outside of the unit.

In this embodiment of the present disclosure as well, as with the above-described first embodiment, photoelectric conversion based on the incident light is carried out in each of the pixels 20 in the image pickup section 11, and signal charges are read out to obtain image signals. Thus, pickup images based on the incident light are obtained. At the time of the turn-off operation of the transistor 22 for signal reading, the row scanning section 13 applies the off-voltage Voff that is set in consideration of the off-leakage current $I_{TFT}$ thereof to the transistor 22. Specifically, in this embodiment of the present disclosure, the off-voltage Voff that is set for each frame frequency is applied to the transistor in such a manner that a difference in charge amount between the off-leakage current $I_{TFT}$ and the dark current $I_{PIN}$ is constant. At the time of shooting, it is possible to suppress a variation in the dark level by switching the off-voltage Voff to a voltage value corresponding to a frame frequency after the switching depending on a switching timing of the frame frequency. As a result, as with the above-described first embodiment, this achieves high quality in pickup images.

It is to be noted that, in the above-described second embodiment of the present disclosure, a voltage value of the off-voltage Voff is optimized for each frame frequency, and each voltage value is related to a frame frequency and is held in the LUT 12. However, further, a voltage value may be set in consideration of the temperature characteristics. In this case, a variation in the dark level with respect to temperature variation is measured beforehand in addition to the frame frequency, and an optimal voltage value for each of the frame frequency and temperature is held correspondingly. Furthermore, a temperature sensor and the like are arranged within the unit. At the time of shooting, an optimal voltage value is selected on the basis of a frame frequency to be used and temperature information from the temperature sensor. In such a manner, a voltage value may be set in consideration of the temperature characteristics as well, and more elaborate control that is adapted to the characteristics of the transistor 22 may be carried out.

Hereinafter, the descriptions are provided on modification examples (modification examples 1 to 6) of the above-described first and second embodiments of the present disclosure. It is to be noted that any components same as those in the above-described first and second embodiments of the present disclosure are denoted with the same reference numerals, and the related descriptions are omitted as appropriate.

Modification Example 1

Figure 16:
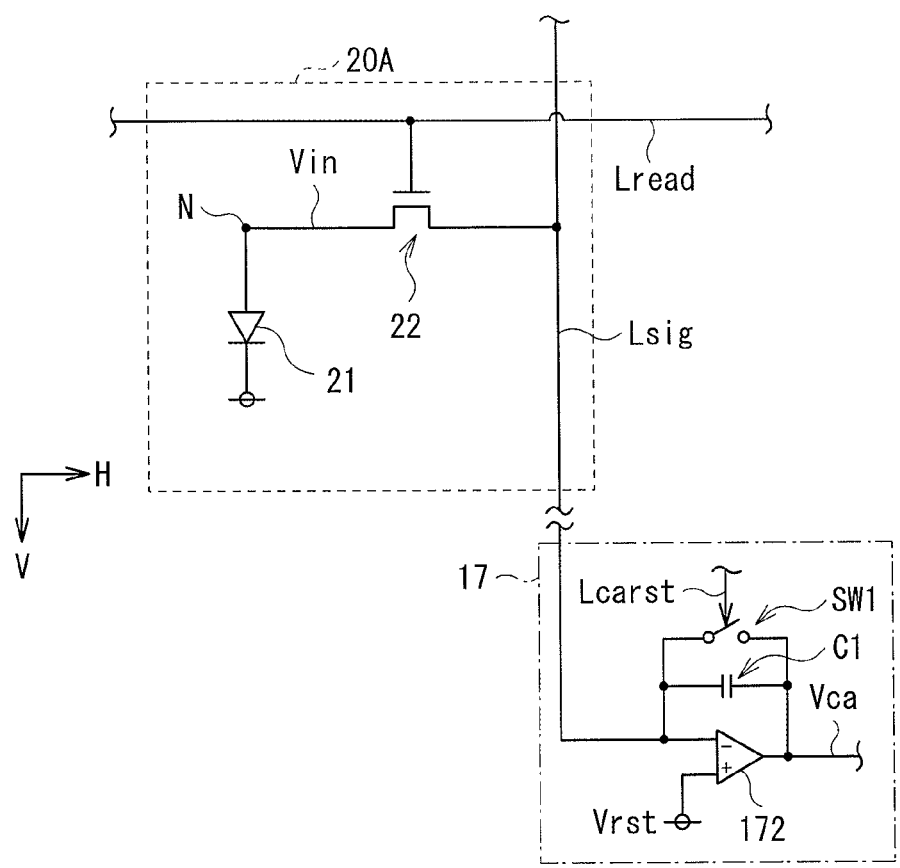
FIG. 16 is a circuit diagram showing a configuration of a pixel and the like according to a modification example 1.

FIG. 16 shows a circuit configuration of a pixel (pixel 20A) according to a modification example 1 along with a circuit configuration example of a column selecting section 17. As with the pixel 20 according to the above-described embodiments of the present disclosure, the pixel 20A employs a passive circuit configuration, having one photoelectric converter device 21 and one transistor 22. Further, the readout control line Lread and the signal line Lsig are connected with the pixel 20A.

However, in the pixel 20A according to this modification example, unlike the pixel 20 according to the above-described embodiments of the present disclosure, an anode of the photoelectric converter device 21 is connected with the accumulation node N, while a cathode thereof is connected with a power supply. In this manner, the accumulation node N may be connected with the anode of the photoelectric converter device 21 in the pixel 20A, and also in this case, it is possible to achieve an effect equivalent to that in the image pickup unit 1 according to the above-described embodiments of the present disclosure.

Modification Example 2

Figure 17:
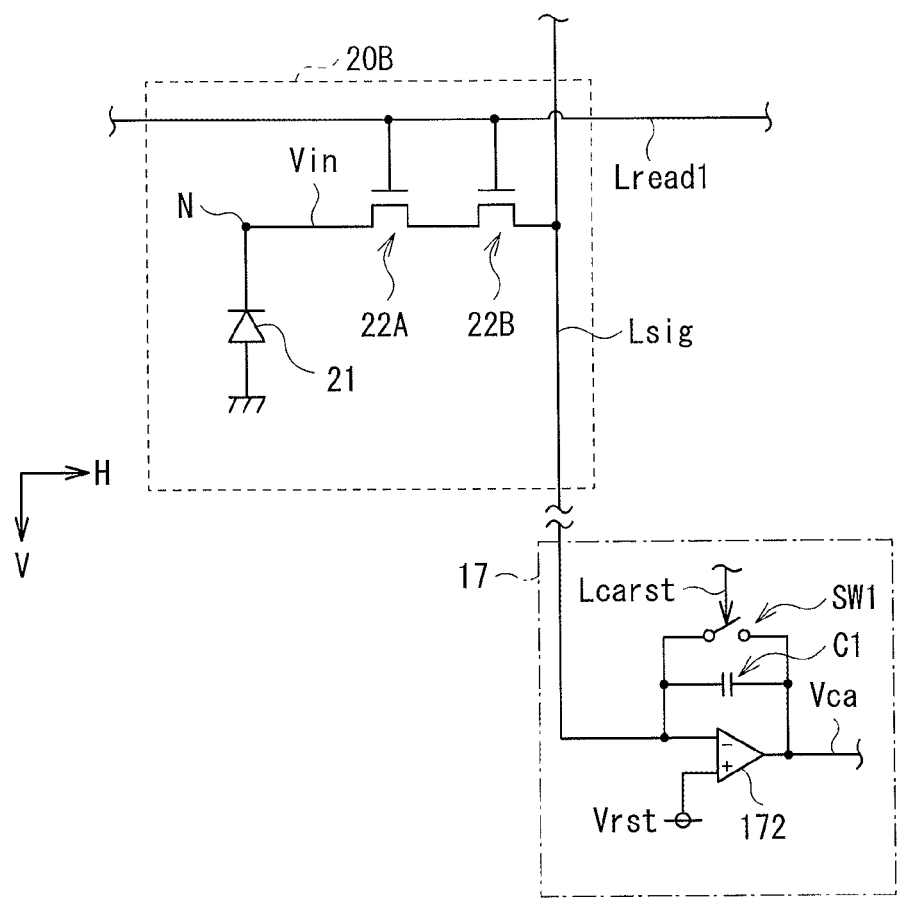
FIG. 17 is a circuit diagram showing a configuration of a pixel and the like according to a modification example 2.

FIG. 17 shows a circuit configuration of a pixel (pixel 20B) according to a modification example 2 along with a circuit configuration example of a column selecting section 17. As with the pixel 20 according to the above-described embodiments of the present disclosure, the pixel 20B employs a passive circuit configuration, being connected with the readout control line Lread and the signal line Lsig.

In this modification example, however, the pixel 20B has one photoelectric converter device 21 and two transistors (transistors 22A and 22B). These two transistors 22A and 22B are connected with one another serially (a source or drain of one of the transistors 22A and 22B is electrically connected with a source or a drain of the other). Further, a gate of each of the transistors 22A and 22B is connected with the readout control line Lread.

In this manner, two transistors 22A and 22B that are connected serially may be provided within the pixel 20B, and also in this case, it is possible to achieve an effect equivalent to that in the above-described embodiments of the present disclosure.

Modification Examples 3 and 4

Figure 18:
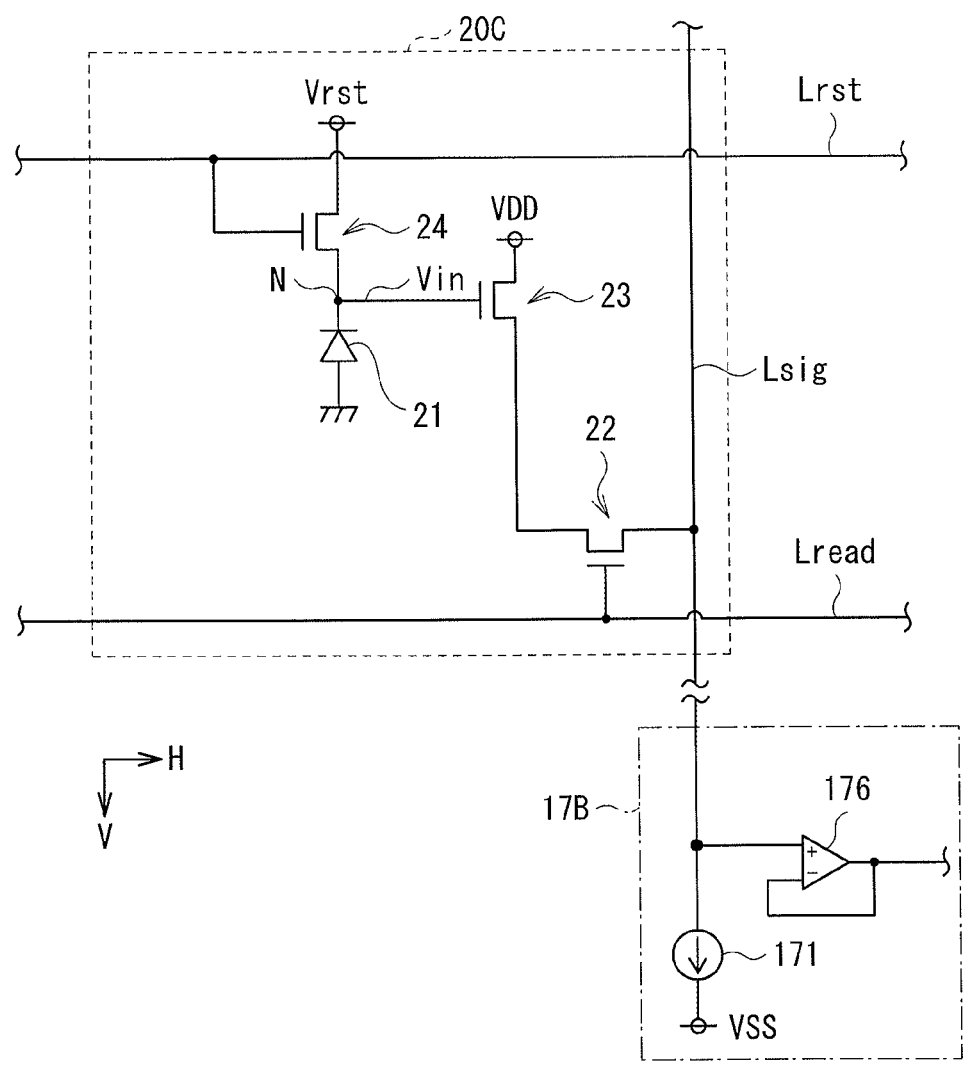
FIG. 18 is a circuit diagram showing a configuration of a pixel and the like according to a modification example 3.
Figure 19:
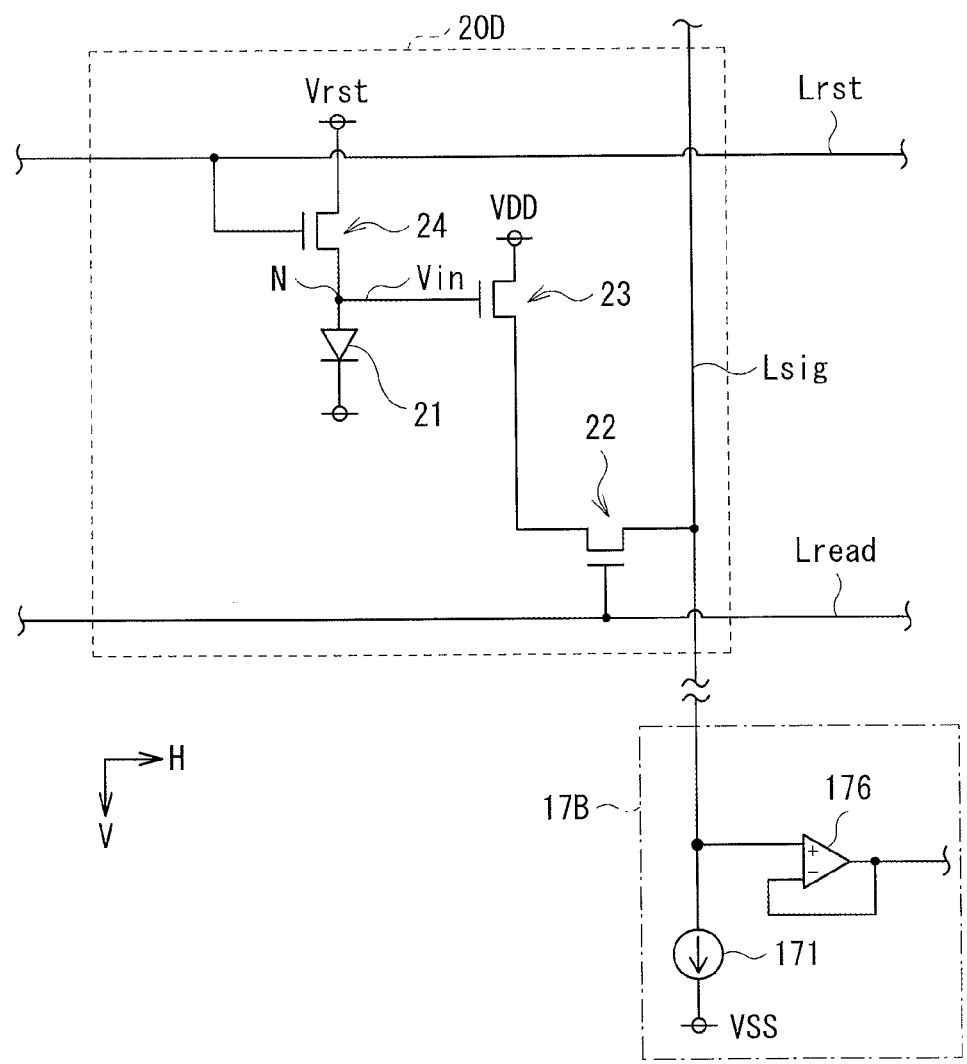
FIG. 19 is a circuit diagram showing a configuration of a pixel and the like according to a modification example 4.

FIG. 18 shows a circuit configuration of a pixel (pixel 20C) according to a modification example 3 along with a circuit configuration example of a column selecting section 17B to be hereinafter described. FIG. 19 shows a circuit configuration of a pixel (pixel 20D) according to a modification example 4 along with a circuit configuration example of the column selecting section 17B. Unlike the pixels 20, 20A, and 20B that are described hitherto, each of these pixels 20C and 20D has a so-called active pixel circuit.

In each of these pixels 20C and 20D, there are provided one photoelectric converter device 21 and three transistors 22, 23, and 24. In addition to the readout control line Lread and the signal line Lsig, a reset control line Lrst is also connected with each of these pixels 20C and 20D.

In each of the pixels 20C and 20D, a gate of the transistor 22 is connected with the readout control line Lread, a source thereof is connected with the signal line Lsig, and a drain thereof is connected with a drain of the transistor 23 configuring a source follower circuit. A source of the transistor 23 is connected with a power supply VDD, and a gate thereof is connected with a cathode (example in FIG. 18) or an anode (example in FIG. 19) of the photoelectric converter device 21 as well as with a drain of the transistor 24 functioning as a reset transistor via the accumulation node N. A gate of the transistor 24 is connected with the reset control line Lrst, and a reset voltage Vrst is applied to a source thereof. In the modification example 4 in FIG. 18, an anode of the photoelectric converter device 21 is connected with a ground (is grounded), and in the modification example 5 in FIG. 19, a cathode of the photoelectric converter device 21 is connected with a power supply.

The column selecting section 17B is provided with a constant current source 171 and an amplifier 176 instead of the charge amplifier 172, the capacitor device C1, and the switch SW1 in the above-described column selecting section 17. In the amplifier 176, the signal line Lsig is connected with a positive input terminal, and a negative input terminal and an output terminal are connected with each other to form a voltage follower circuit. It is to be noted that a first terminal of the constant current source 171 is connected with one end side of the signal line Lsig, and a power supply VSS is connected with a second terminal of the constant current source 171.

In the image pickup unit having such active pixels 20C and 20D as well, as with the above-described embodiments of the present disclosure, control of the off-voltage Voff as described above makes it possible to suppress occurrence of a shot noise or variation in the dark level. As a result, it is possible to achieve an effect equivalent to that in the above-described embodiments of the present disclosure.

Modification Example 5

Figure 20A:
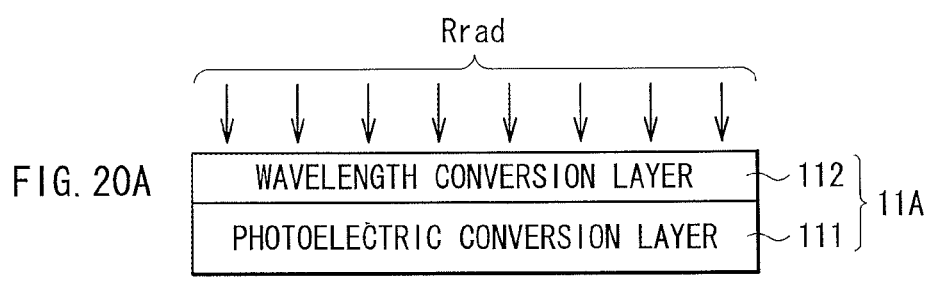
FIG. 20A is a schematic diagram showing a simplified configuration of an image pickup section according to a modification example 5.

FIG. 20A schematically shows a simplified configuration of an image pickup section (image pickup section 11A) according to a modification example 5. The image pickup section 11A has a wavelength conversion layer 112 additionally on the photoelectric conversion layer 111 (on an optical receiving surface side) that is described in the above-described embodiments of the present disclosure. The wavelength conversion layer 112 performs wavelength conversion on a radiation ray Rrad (α-ray, β-ray, γ-ray, X-ray, and/or the like) to allow the ray to have a sensitivity zone of the photoelectric conversion layer 111, making it possible to read information based on this radiation ray Rrad in the photoelectric conversion layer 111. The wavelength conversion layer 112 is configured of, for example, a phosphor (for instance, scintillator) that converts a radiation ray such as an X-ray into visible light. Such a wavelength conversion layer 112 is obtained in such a manner that, for example, a planarizing film configured of an organic planarizing film, a spin-on-glass material, and/or the like is formed on the photoelectric conversion layer 111, and a phosphor film is formed thereon using CsI, NaI, $CaF_2$, and/or the like. The image pickup section 11A is applicable to a so-called indirect-type radiographic image pickup unit, for example.

Modification Example 6

Figure 20B:
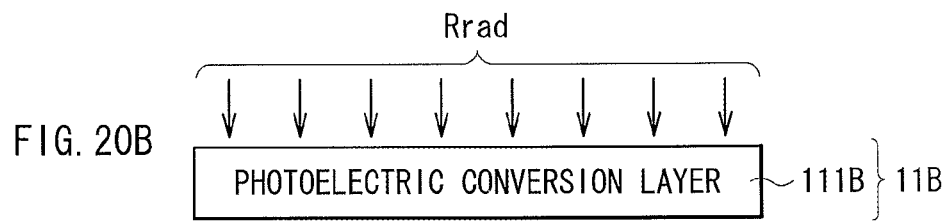
FIG. 20B is a schematic diagram showing a simplified configuration of an image pickup section according to a modification example 6.

FIG. 20B schematically shows a simplified configuration of an image pickup section (image pickup section 11B) according to a modification example 6. Unlike the above-described embodiments of the present disclosure, the image pickup section 11B has a photoelectric conversion layer 111B that converts an incident radiation ray Rrad into an electric signal. The photoelectric conversion layer 111B is configured of, for example, amorphous selenium (a-Se) semiconductor, cadmium tellurium (CdTe) semiconductor, and/or the like. The image pickup section 11B is applicable to a so-called direct-type radiographic image pickup unit, for example.

The image pickup unit including the image pickup sections 11A and 11B according to the above-described modification examples 5 and 6 are utilized as various types of radiographic image pickup units that obtain electric signals based on the incident radiation ray Rrad. As a radiographic image pickup unit, such an image pickup unit is applicable to, for example, a medical X-ray image pickup unit (such as digital radiography), a portable object inspection X-ray image pickup unit in use at airports and other places, an industrial X-ray image pickup unit (for example, an unit for inspection of dangerous objects in containers, or an unit for inspection of objects in bags), and the like.

It is to be noted that such a vision-through application (medical application) uses frame frequencies within a range of approximately 7.5 fps to 30 fps, for example, and a single frame period is often approximately one second or less. In this case, it is likely that the image pickup unit may be influenced by the off-leakage current $I_{TFT}$ during the transient period, and therefore, the off-voltage control technique that is described in the above-described first embodiment of the present disclosure is effective.

Further, in such a vision-through application (medical application), shooting is often carried out by switching a frame frequency at an arbitrary timing. Hereupon, examples of the medical application include radiography that is mainly a still image pickup technique and fluoroscopy that is a moving image pickup technique, although the fluoroscopy sometimes switches a frame frequency in the middle of shooting. For example, in the case of blood vessel shooting and the like, there is a use where a catheter operation is performed while performing moving image shooting (approximately 7.5 fps), and still image shooting (equivalent to approximately 1 fps) is performed in-mid course, following which switching to the moving image shooting (approximately 7.5 fps) is performed again. In such a case, the off-voltage control technique in the image pickup unit 1A according to the above-described second embodiment of the present disclosure is especially useful. Even if a frame frequency is varied, as described above, it is possible to suppress a variation in the dark level and to achieve high quality of images.

Application Example

The image pickup units according to the embodiments of the present disclosure and the modification examples (modification examples 1 to 6) described above are applicable to an image pickup display system as described below.

Figure 21:
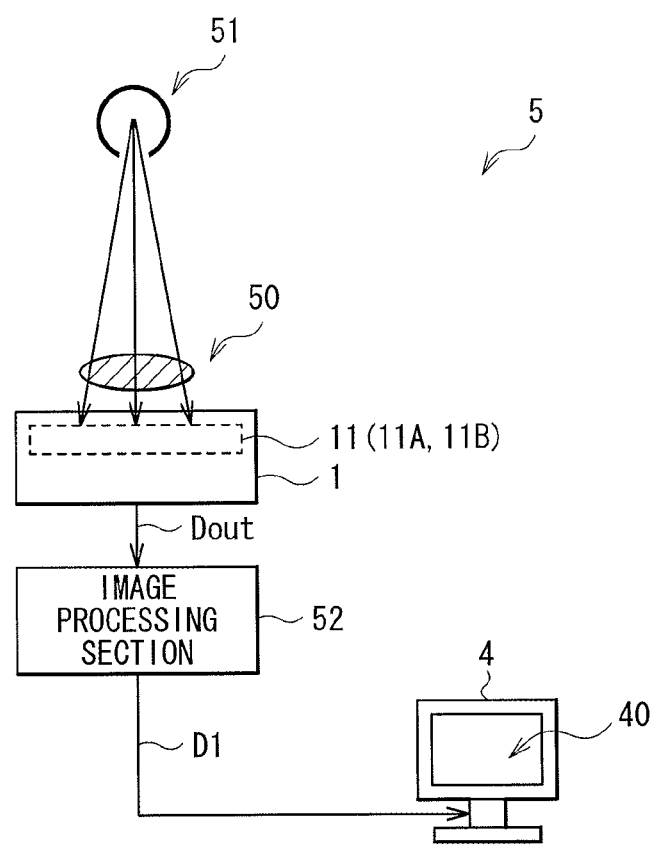
FIG. 21 is a schematic diagram showing a simplified configuration of an image pickup display system according to an application example.

FIG. 21 schematically shows a simplified configuration example of an image pickup display system (image pickup display system 5) according to an application example. The image pickup display system 5 includes an image pickup unit 1 having the above-described image pickup section 11 (or an image pickup section 11A or 11B), an image processing section 52, and a display unit 4. The image pickup display system 5 is an image pickup display system (radiographic image pickup display system) using a radiation ray in this example.

The image processing section 52 generates image data D1 by performing a predetermined image processing on output data Dout (image pickup signal) that is output from the image pickup unit 1. The display unit 4 performs image display based on the image data D1 generated in the image processing section 52 on a predetermined monitor screen 40.

In the image pickup display system 5, the image pickup unit 1 (radiographic image pickup unit, here) obtains image data Dout of a subject 50 on the basis of irradiation light (radiation ray, here) that is irradiated from a light source (radiation source such as an X-ray source, here) toward the subject 50 to output the image data Dout to the image processing section 52. The image processing section 52 performs the predetermined image processing described above on the incoming image data Dout to output the image data (display data) D1 after the image processing to the display unit 4. The display unit 4 displays image information (pickup image) on the monitor screen 40 on the basis of the incoming image data D1.

As described above, in the image pickup display system 5 according to this application example, it is possible to obtain an image of the subject 50 as an electric signal in the image pickup unit 1, which allows image display to be performed by transmitting the obtained electric signal to the display unit 4. In other words, it is possible to observe an image of the subject 50 without using existing radiograph films, as well as to deal with both motion image shooting and motion image display.

It is to be noted that, in this application example, the description is provided by citing a case where the image pickup unit 1 is configured as a radiographic image pickup unit to be an image pickup display system using a radiation ray. However, the image pickup display system according to the present technology is also applicable to any system using any other method image pickup unit.

The present technology is described with reference to the embodiments, modification examples, and application examples. However, the present technology is not limited to the above-described embodiments of the present disclosure and the like, but may be variously modified. For example, a pixel circuit configuration in the image pickup section is not limited to those described in the above-described embodiments of the present disclosure and the like (circuit configurations of pixels 20 and 20A to 20D), and any other circuit configuration may be used. Similarly, circuit configurations of the row scanning section, the column selecting section, and the like are also not limited to those described in the above-described embodiments of the present disclosure and the like, and any other circuit configuration may be adopted.

Further, each of the image pickup section, the row scanning section, the A/D conversion section (column selecting section), the column scanning section, and the like that are described in the above-described embodiments of the present disclosure and the like may be formed on the same substrate, for example. Specifically, use of a polycrystalline semiconductor such as low-temperature polycrystalline silicon also allows switches and the like in those circuit sections to be formed on the same substrate. This makes it possible to perform a driving operation on the same substrate on the basis of a control signal from an external system control section, for example, thereby allowing to achieve a narrowed frame (three-side-free frame structure) and the improved reliability at the time of wiring connections.

It is possible to achieve at least the following configurations from the above-described example embodiments and the modifications of the disclosure.

(1) An image pickup unit, including:

an image pickup section including a plurality of pixels, the plurality of pixels each including a photoelectric converter device and a field-effect transistor; and a driving section reading out a signal charge with use of the transistor, the signal charge being accumulated in each of the plurality of pixels; wherein the driving section turns off the transistor by applying an off-voltage to the transistor, the off-voltage being set in consideration of an off-leakage current between a source and a drain of the transistor.

(2) The image pickup unit according to (1), wherein the driving section reads out the signal charge while switching a plurality of frame frequencies at a predetermined timing in video shooting, and the driving section switches the off-voltage in accordance with the predetermined timing of the switching of the frame frequencies.

(3) The image pickup unit according to (2), wherein, in switching the frame frequencies, the driving section turns off the transistor with use of a voltage value corresponding to a frame frequency after the switching among a plurality of voltage values that are held each being related to each of the plurality of frame frequencies.

(4) The image pickup unit according to (3), wherein each of the plurality of voltage values is set to allow a difference in charge amount between the off-leakage current of the transistor and a dark current of the photoelectric converter device to be constant between cases of the plurality of frame frequencies.

(5) The image pickup unit according to (4), wherein each of the plurality of voltage values is set to allow the difference in the charge amount to be minimum.

(6) The image pickup unit according to (1), wherein a value of the off-voltage is a fixed value.

(7) The image pickup unit according to (6), wherein
a channel of the transistor is configured of low-temperature polysilicon, and
the off-voltage is set at a value within a range of approximately −5 V or more and less than approximately 0 V.

(8) The image pickup unit according to (7), wherein the off-voltage is set at a value within a range of approximately −3.5 V or more and less than approximately 0V.

(9) The image pickup unit according to any one of (1) to (8), wherein the photoelectric converter device is configured of one of a PIN-type photodiode and an MIS-type sensor.

(10) The image pickup unit according to any one of (1) to (9), wherein the image pickup section generates an electric signal based on an incident radiation ray.

(11) The image pickup unit according to any one of (1) to (10), wherein the image pickup section includes a wavelength conversion layer on the photoelectric converter device, the wavelength conversion layer converting a radiation ray into a ray in a sensitivity zone of the photoelectric converter device.

(12) The image pickup unit according to (11), wherein the radiation ray is an X-ray.

(13) An image pickup display system, including:
an image pickup unit; and
a display unit performing image display based on an image pickup signal obtained by the image pickup unit; wherein
the image pickup unit includes
an image pickup section including a plurality of pixels, the plurality of pixels each including a photoelectric converter device and a field-effect transistor, and
a driving section reading out a signal charge with use of the transistor, the signal charge being accumulated in each of the plurality of pixels, and
the driving section turns off the transistor by applying an off-voltage to the transistor, the off-voltage being set in consideration of an off-leakage current between a source and a drain of the transistor.

It should be understood by those skilled in the art that various modifications, combinations, sub-combinations, and alterations may occur depending on design requirements and other factors insofar as they are within the scope of the appended claims or the equivalents thereof.

What is claimed is:

1. An image pickup unit, comprising:
an image pickup section including a plurality of pixels, the plurality of pixels each including a photoelectric converter device and a field-effect transistor; and
a driving section reading out a signal charge with use of the transistor, the signal charge being accumulated in each of the plurality of pixels;
wherein the driving section applies an off-voltage to the transistor to turn off the transistor, wherein a value of the off-voltage is set in accordance with a leakage current which flows between a source and a drain of the transistor in an event of an off state of the transistor.

2. The image pickup unit according to claim 1, wherein the driving section reads out the signal charge while switching a plurality of frame frequencies at a predetermined timing in video shooting, and the driving section switches the off-voltage in accordance with the predetermined timing of the switching of the frame frequencies.

3. The image pickup unit according to claim 2, wherein, in switching the frame frequencies, the driving section turns off the transistor with use of a voltage value corresponding to a frame frequency after the switching among a plurality of voltage values that are held each being related to each of the plurality of frame frequencies.

4. The image pickup unit according to claim 3, wherein each of the plurality of voltage values is set to allow a difference in charge amount between the leakage current of the transistor and a dark current of the photoelectric converter device to be constant between cases of the plurality of frame frequencies.

5. The image pickup unit according to claim 4, wherein each of the plurality of voltage values is set to allow the difference in the charge amount to be minimum.

6. The image pickup unit according to claim 1, wherein a value of the off-voltage is a fixed value.

7. The image pickup unit according to claim 1, wherein a channel of the transistor is configured of low-temperature polysilicon, and the off-voltage is set at a value within a range of approximately −5 V or more and less than approximately 0 V.

8. The image pickup unit according to claim 1, wherein the off-voltage is set at a value within a range of approximately −3.5 V or more and less than approximately 0 V.

9. The image pickup unit according to claim 1, wherein the photoelectric converter device is configured of one of a PIN-type photodiode and an MIS-type sensor.

10. The image pickup unit according to claim 1, wherein the image pickup section generates an electric signal based on an incident radiation ray.

11. The image pickup unit according to claim 1, wherein the image pickup section includes a wavelength conversion layer on the photoelectric converter device, the wavelength conversion layer converting a radiation ray into a ray in a sensitivity zone of the photoelectric converter device.

12. The image pickup unit according to claim 11, wherein the radiation ray is an X-ray.

13. The image pickup unit according to claim 1, wherein the off-voltage is set in order to suppress the leakage current of the transistor during a transient period.

14. The image pickup unit according to claim 1, wherein the value of the off-voltage is set in accordance with a frame frequency with which video shooting is performed.

15. The image pickup unit according to claim 1, further comprising a lookup table for storing a plurality of values of the off-voltage which corresponds to each of a plurality of frame frequencies with which video shooting is performed.

16. An image pickup display system, comprising:
an image pickup unit; and
a display unit performing image display based on an image pickup signal obtained by the image pickup unit; wherein
the image pickup unit includes
an image pickup section including a plurality of pixels, the plurality of pixels each including a photoelectric converter device and a field-effect transistor, and
a driving section reading out a signal charge with use of the transistor, the signal charge being accumulated in each of the plurality of pixels, and
the driving section applies an off-voltage to the transistor to turn off the transistor, wherein a value of the off-voltage is set in accordance with a leakage current which flows between a source and a drain of the transistor in an event of an off state of the transistor.

17. The image pickup display system according to claim 16, wherein the off-voltage is set in order to suppress the leakage current of the transistor during a transient period.

18. The image pickup display system according to claim 16, wherein the driving section reads out the signal charge while switching a plurality of frame frequencies at a predetermined timing in video shooting, and the driving section switches the off-voltage in accordance with the predetermined timing of the switching of the frame frequencies.

19. The image pickup display system according to claim 18, wherein, in switching the frame frequencies, the driving section turns off the transistor with use of a voltage value corresponding to a frame frequency after the switching among a plurality of voltage values that are held each being related to each of the plurality of frame frequencies.

20. The image pickup display system according to claim 19, wherein each of the plurality of voltage values is set to allow a difference in charge amount between the leakage current of the transistor and a dark current of the photoelectric converter device to be constant between cases of the plurality of frame frequencies.

21. An image pickup unit, comprising:
an image pickup section including a plurality of pixels, the plurality of pixels each including a photoelectric converter device and a field-effect transistor; and
a driving section reading out a signal charge with use of the transistor, the signal charge being accumulated in each of the plurality of pixels;
wherein the driving section turns off the transistor by applying an off-voltage to the transistor, the off-voltage being set in consideration of an off-leakage current between a source and a drain of the transistor,
wherein the driving section reads out the signal charge while switching a plurality of frame frequencies at a predetermined timing in video shooting, and the driving section switches the off-voltage in accordance with the predetermined timing of the switching of the frame frequencies,
wherein, in switching the frame frequencies, the driving section turns off the transistor with use of a voltage value corresponding to a frame frequency after the switching among a plurality of voltage values that are held each being related to each of the plurality of frame frequencies, and
wherein each of the plurality of voltage values is set to allow a difference in charge amount between the off-leakage current of the transistor and a dark current of the photoelectric converter device to be constant between cases of the plurality of frame frequencies.

* * * * *